United States Patent
Kim

(10) Patent No.: US 10,908,506 B2
(45) Date of Patent: Feb. 2, 2021

(54) METHOD OF MANUFACTURING SEMICONDUCTOR DEVICE

(71) Applicant: Samsung Electronics Co., Ltd., Suwon-si (KR)

(72) Inventor: Jang-sun Kim, Hwaseong-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 0 days.

(21) Appl. No.: 16/559,087

(22) Filed: Sep. 3, 2019

(65) Prior Publication Data
US 2020/0233312 A1   Jul. 23, 2020

(30) Foreign Application Priority Data
Jan. 21, 2019   (KR) .................. 10-2019-0007579

(51) Int. Cl.
*G03B 27/54* (2006.01)
*G03F 7/20* (2006.01)
*H01L 21/67* (2006.01)
*G03F 9/00* (2006.01)

(52) U.S. Cl.
CPC ...... *G03F 7/70058* (2013.01); *G03F 7/70258* (2013.01); *G03F 7/70691* (2013.01); *G03F 9/7003* (2013.01); *H01L 21/67259* (2013.01)

(58) Field of Classification Search
CPC ............ G03F 7/70058; G03F 7/70258; G03F 7/70691; G03F 7/70633; G03F 7/705; G03F 9/7003; H01L 21/67259
See application file for complete search history.

(56) References Cited

U.S. PATENT DOCUMENTS

| | | | |
|---|---|---|---|
| 6,235,438 B1 | 5/2001 | Suzuki et al. | |
| 7,379,154 B2 | 5/2008 | Bruls et al. | |
| 9,209,052 B2 | 12/2015 | Nakajima et al. | |
| 9,966,284 B2 | 5/2018 | Takakuwa | |
| 2008/0228435 A1* | 9/2008 | Lee ................. | G03F 7/70508 702/150 |
| 2014/0168629 A1 | 6/2014 | Nishida et al. | |
| 2016/0047744 A1* | 2/2016 | Adel ................ | G01B 11/272 356/401 |
| 2016/0290789 A1 | 10/2016 | Smith et al. | |

FOREIGN PATENT DOCUMENTS

| | | |
|---|---|---|
| EP | 1496397 A1 | 12/2005 |
| JP | 2013-247258 A | 12/2012 |

* cited by examiner

*Primary Examiner* — Peter B Kim
(74) *Attorney, Agent, or Firm* — Muir Patent Law, PLLC

(57) ABSTRACT

A method of manufacturing a semiconductor device includes: providing a first photoresist pattern on a wafer; measuring an overlay of the first photoresist pattern; generating a first overlay model function by a first overlay regression analysis of the measured overlay; and generating a second overlay model function by a second overlay regression analysis of a difference between the measured overlay and the first overlay model function.

18 Claims, 17 Drawing Sheets

_US 10,908,506 B2_

METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2019-0007579, filed on Jan. 21, 2019, in the Korean Intellectual Property Office, the disclosure of which is incorporated herein in its entirety by reference.

BACKGROUND

The inventive concept relates to a method of manufacturing a semiconductor device, and more particularly, to a method of manufacturing a semiconductor device improving reliability and manufacturing yield of the semiconductor device.

In manufacturing semiconductor devices, various semiconductor processes are performed on wafers, and each of the processes may utilize a semiconductor material or the like. Semiconductor processes (processes manufacturing semiconductor devices) may include, for example, deposition processes for depositing material layers on wafers, photolithography processes for defining patterns on wafers, etching processes for etching material layers of wafers, processes of implanting impurities into wafers, and the like. Semiconductor devices may be formed according to designed layouts by performing such semiconductor processes. After performing semiconductor processes, various methods of determining the progress status (e.g. performance) of the semiconductor processes and whether there are faults have been studied. Among such methods, overlay measurement having high reliability and high precision is one of the key elements for accomplishing high product yield in the manufacture of semiconductor devices. As semiconductor devices have been miniaturized and highly integrated, various studies for improving the accuracy and reliability of overlay measurement have been made/performed.

SUMMARY

The inventive concept provides a method of manufacturing a semiconductor device, the method improving reliability and manufacturing yield of the semiconductor device.

The inventive concept is not limited to the aspect set forth above, and other aspects of the inventive concept will be clearly understood by those skilled in the art from the following descriptions.

According to an aspect of the inventive concept, there is provided a method of manufacturing a semiconductor device, the method including: providing a first photoresist pattern on a wafer; measuring an overlay of the first photoresist pattern; generating a first overlay model function by a first overlay regression analysis of the measured overlay; and generating a second overlay model function by a second overlay regression analysis of a difference between the measured overlay and the first overlay model function.

According to another aspect of the inventive concept, there is provided a method of manufacturing a semiconductor device, the method including: providing a first photoresist pattern on a first wafer; measuring an overlay of the first photoresist pattern; generating a first overlay model function by a first overlay regression analysis of the measured overlay; generating a second overlay model function by a second overlay regression analysis of a difference between the measured overlay and the first overlay model function; and providing a second photoresist pattern on a second wafer, the second photoresist pattern being overlay-compensated by the first and second overlay model functions.

According to yet another aspect of the inventive concept, there is provided a method of manufacturing a semiconductor device, the method including: providing a first photoresist material layer on a wafer; exposing the first photoresist material layer to a light pattern; measuring an overlay of the wafer; generating a first overlay model function by a first overlay regression analysis of the measured overlay; and generating a second overlay model function by a second overlay regression analysis of a difference between the measured overlay and the first overlay model function, wherein the first overlay model function includes only first-order and/or lower than first-order terms and the second overlay model function includes only second-order and/or higher than second-order terms.

BRIEF DESCRIPTION OF THE DRAWINGS

Embodiments of the inventive concept will be more clearly understood from the following detailed description taken in conjunction with the accompanying drawings in which:

FIG. 6A illustrates a memory chip wafer and FIG. 6B illustrates a logic chip wafer;

DETAILED DESCRIPTION OF THE EMBODIMENTS

Figure 1:
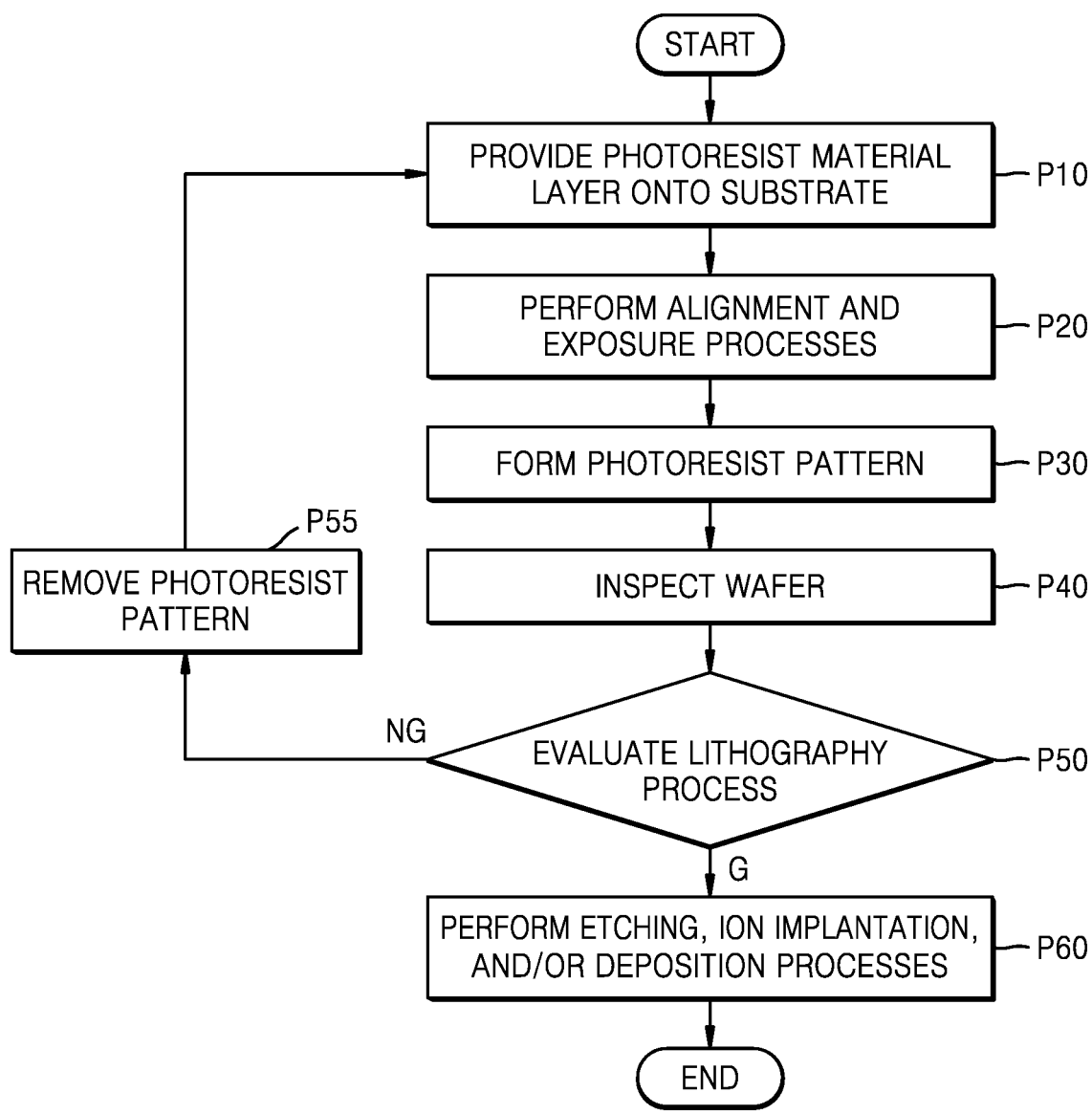
FIG. 1 is a flowchart illustrating a method of manufacturing a semiconductor device, according to some embodiments.

Hereinafter, embodiments of the inventive concept will be described in detail with reference to the accompanying drawings. Like components will be denoted by like reference numerals throughout the specification, and repeated descriptions thereof will be omitted.

Figure 2:
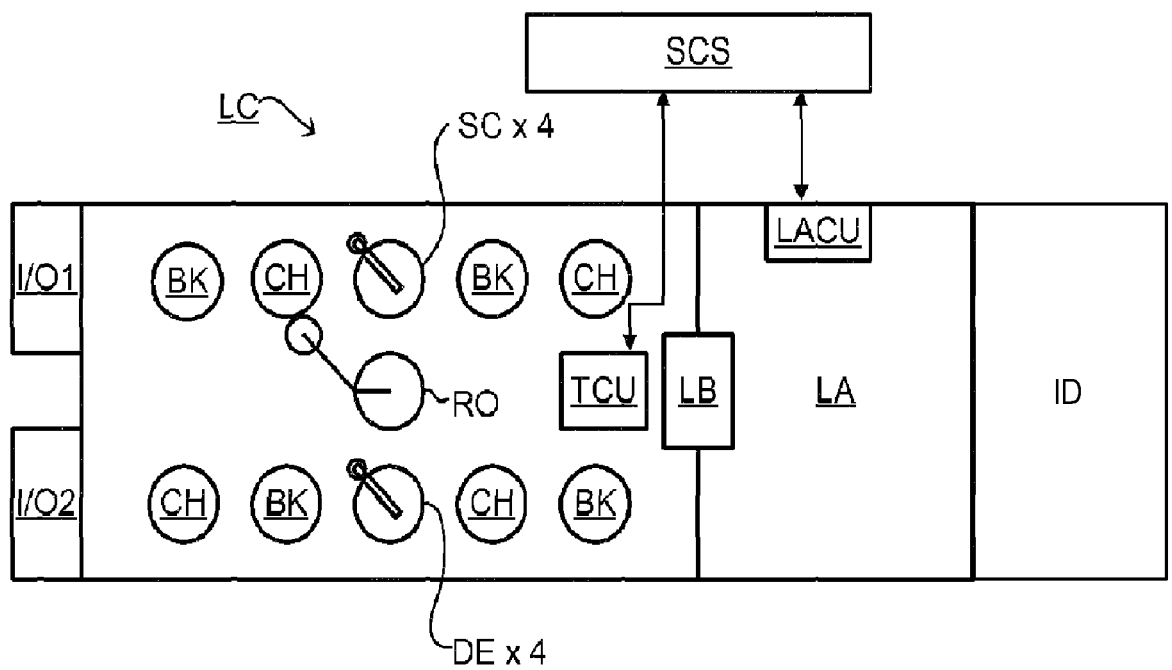
FIG. 2 is a schematic plan view illustrating an example lithography cell that may be used for a method of manufacturing a semiconductor device, according to some embodiments.

FIG. 1 is a flowchart illustrating a method of manufacturing a semiconductor device, according to some embodiments. FIG. 2 is a schematic plan view illustrating an example lithography cell that may be used for a method of manufacturing a semiconductor device, according to some embodiments.

Referring to FIGS. 1 and 2, a lithography cell LC may include first and second input/output ports I/O1 and I/O2, a plurality of bake plates BK, a plurality of spin coaters SC (for example, four spin coaters SC), a plurality of chill/cooling plates CH, a plurality of developers DE (for example, four developers DE), a handler robot RO, a track control unit TCU, a loading bay LB, a lithography apparatus LA, a supervisory control system SCS, a lithography control apparatus LACU, and an inspection apparatus ID.

The lithography cell LC may be an apparatus performing a series of sub-processes constituting a photolithography process. For example, the lithography cell LC may perform processes such as adhesion promotion, photoresist coating, soft bake, alignment, exposure, post-exposure bake, development, wafer inspection, and hard bake. For example, lithography may refer to photolithography which may comprise lithography using visible light, ultraviolet light, infrared light, X-rays, gamma rays, etc. . . .

In a process P10, the lithography cell LC may provide a photoresist material layer on a wafer. The providing of the photoresist material layer may include an adhesion promotion process and a spin coating process.

Here, the adhesion promotion process is for bonding a photoresist to a wafer or bonding circuit patterns on the wafer. In some cases, a photoresist material may have insufficient adhesion (insufficient adhesive strength) with respect to a surface of silicon or a surface of a silicon-containing material. Thus, before providing the photoresist material on the wafer, the adhesion promotion process may be performed on a surface of the wafer. A representative adhesion promotion method includes treating the surface of the wafer with hexamethyldisilazane (HMDS). HMDS may make the surface of the wafer hydrophobic and thus improve adhesion between the photoresist material and the wafer. However, the adhesion promotion method is not limited to HMDS treatment, and other hydrophobic materials may be used to improve adhesive strength of the photoresist.

Each spin coater SC may perform a spin coating process. The spin coating process is a process of providing the photoresist material layer on the wafer. The photoresist material may include an organic polymer and may be coated on the wafer as a solution. To coat wafers with the photoresist material, each wafer, to which the photoresist in a solution state is provided, may be spun at a high speed. As a surplus of the photoresist material departs from the wafer by the spin-rotation of the wafer and a solvent is vaporized, a thin (for example, about 0.1 μm to about 2 μm-thick) photoresist material layer in a solid state may be provided/coated on the wafer.

Here, the handler robot RO may pick up the wafers from the first and second input/output ports I/O1 and 1/O2 and move the wafers between different process apparatuses. The handler robot RO may transfer process-completed wafers to the loading bay LB of the lithography apparatus LA. The handler robot RO, the first and second input/output ports I/O1 and I/O2, and the loading bay LB may be collectively referred to as a transfer track.

The track control unit TCU may control operations of the handler robot RO, the first and second input/output ports I/O1 and I/O2, and the loading bay LB. The track control unit TCU may be controlled by the supervisory control system SCS. The supervisory control system SCS may be controlled by the lithography control apparatus LACU.

According to some embodiments, after the spin coating process, a soft bake process may be optionally performed. In some cases, the density of the photoresist material layer coated on the wafer may be insufficient to perform a subsequent process. The soft bake process may allow the photoresist material layer to be dense and may remove the solvent remaining on the photoresist material layer.

The soft bake process may be performed by a bake plate BK. The wafer having undergone the soft bake process may be optionally placed on a chill/cooling plate CH and thus cooled. According to some embodiments, the chill/cooling plate CH may include a set of heat dissipation structure, thereby effectively cooling the wafer, which has undergone a bake process and is at a high temperature. The bake plate BK may further perform bake processes such as post-exposure bake and hard bake, as described below.

Next, in a process P20, alignment and exposure processes may be performed. The alignment and exposure processes may be performed by the lithography apparatus LA. Hereinafter, the process P20 and a configuration of the lithography apparatus LA will be described in more detail with reference to FIG. 3.

Figure 3:
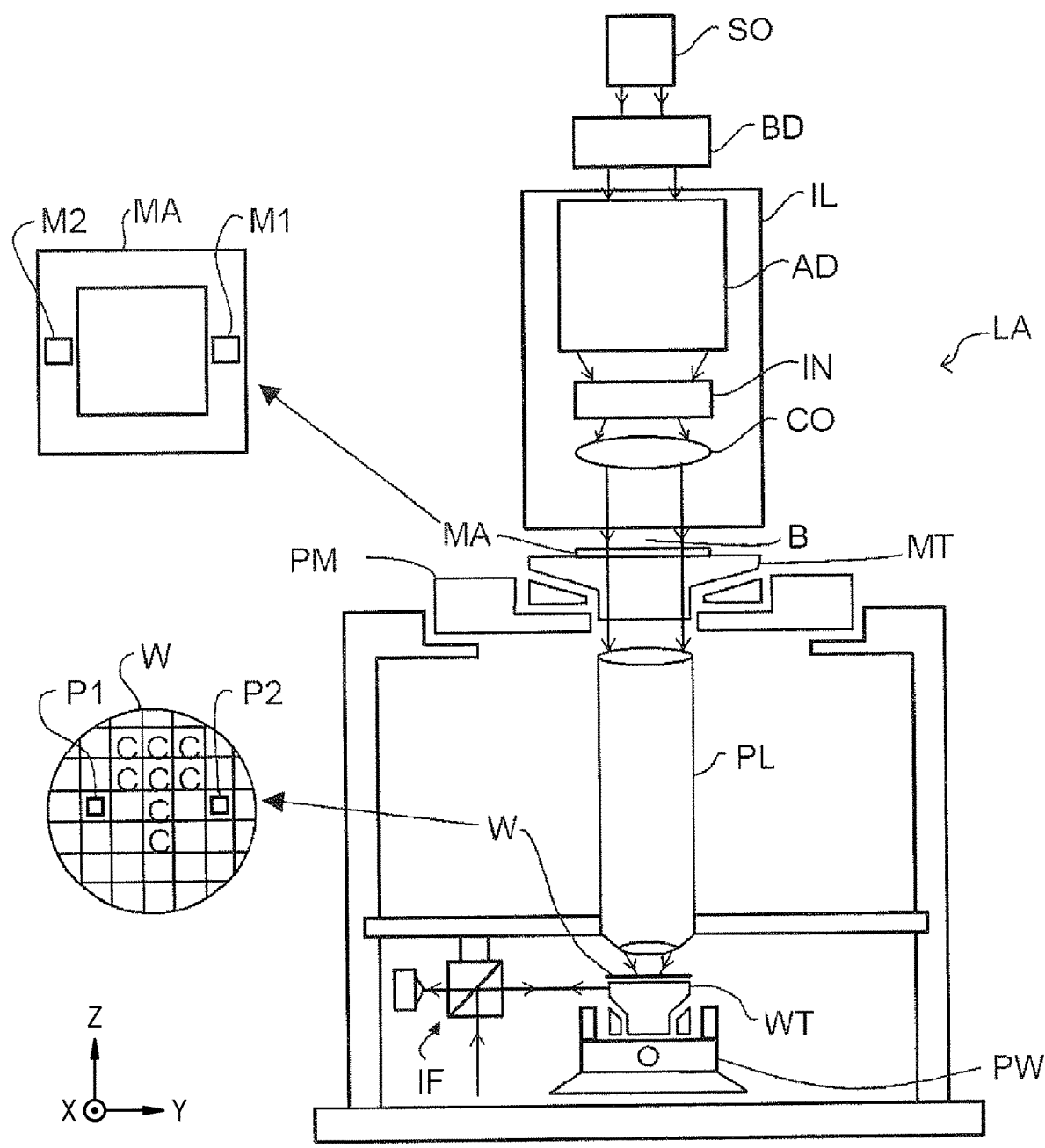
FIG. 3 is a schematic cross-sectional view illustrating a lithography apparatus that may be used for a method of manufacturing a semiconductor device, according to some embodiments.

FIG. 3 is a schematic cross-sectional view illustrating the lithography apparatus LA that may be used for a method of manufacturing a semiconductor device, according to some embodiments.

The lithography apparatus LA may include a beam source SO, an illuminator IL, a patterning device MA, a first positioner PM, a mask table MT, a second positioner PW, a wafer table WT, and a projection system PL.

Herein, two directions, which are substantially perpendicular to each other and substantially parallel to a top surface of a wafer W placed in the lithography apparatus LA, are respectively defined as first and second directions (X and Y directions). In addition, a direction, which is substantially perpendicular to the top surface of the wafer W, is defined as a third direction (Z direction). Unless otherwise stated, the definition of directions is identically applied throughout the specification. Terms such as "parallel," "perpendicular," "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially parallel," or "substantially planar," may be exactly the same, equal, parallel, or planar, or may be the same, equal, parallel, or planar within acceptable variations that may occur, for example, due to manufacturing processes.

The beam source SO may emit, for example, beams B such as deep ultraviolet (DUV) rays, ultraviolet (UV) rays, excimer laser beams, extreme UV (EUV) rays, X-rays, or electron beams. For example, the beams B may include a radiation of energetic waves (e.g., a light beam or an electromagnetic radiation) or a radiation of particles. In some cases, the beam source SO may be included as a partial component in the lithography apparatus LA or may be separated from the lithography apparatus LA. In the case where the beam source SO includes an excimer laser, the beam source SO may be separated from the lithography apparatus LA. In this case, the beams B radiated by the beam source SO may be delivered to the illuminator IL by a beam delivery system BD including a beam expander. In the case where the source beam SO includes a mercury lamp, the source beam SO may be included in the lithography apparatus LA.

The illuminator IL may receive the beams B from the beam source SO. The illuminator IL may control various properties of the beams B, such as directing the beams B toward a set/predetermined direction, changing the shape of the beams B, or the like. According to some embodiments, the illuminator IL may include various types of optical components, such as a refractive type, a reflective type, a magnetic type, an electromagnetic type, an electrostatic type, or a combination thereof. The illuminator IL may include an adjuster AD adjusting an intensity distribution according to an angle of the beams B. The adjuster AD may adjust an outer radius and/or an inner radius of an intensity distribution of a pupil plane of the illuminator IL, or the like. The illuminator IL may adjust the beams B such that a cross-section of the beams B has intended/proper uniformity and an intended/proper intensity distribution.

The mask table MT may support the patterning device MA. The mask table MT may use various clamping techniques, such as a mechanical type, a vacuum type, an electrostatic type, or the like, to hold the patterning device MA. According to some embodiments, the mask table MT may include a fixed frame or table. According to some other embodiments, the mask table MT may include a movable frame or table. The mask table MT may place the patterning device MA at a set/predetermined position with respect to the projection system PL. The beams B may be incident on the patterning device MA supported by the mask table MT. The cross-section of the beams B incident on the patterning device MA may be changed to a shape/pattern set by the patterning device MA. The projection system PL may include at least one selected from the group consisting of refractive type, reflective type, catadioptric type, magnetic type, electromagnetic type, and electrostatic optical type projection systems.

According to some embodiments, the patterning device MA may be of a transmissive type or a reflective type. The patterning device MA may include, for example, one of a mask, a programmable mirror array, and a programmable LCD panel. When the patterning device MA is of a mask type, the patterning device MA may be of one of a binary type, an alternating phase-shift type, an attenuated phase-shift type, and various hybrid types, without being limited thereto.

When the patterning device MA includes a programmable mirror array, the patterning device MA may include, for example, a set of small mirrors arranged in a matrix form. The small mirrors included in the patterning device MA may be individually inclined and thus reflect the beams B incident thereon in different directions, respectively. The respective small mirrors that are inclined may form a pattern in the beams B reflected by a mirror matrix.

Next, the beams B may pass through the projection system PL. The projection system PL may focus the beams B on a target portion C of the wafer W. According to some embodiments, the second positioner PW and a position sensor IF may drive the wafer table WT such that the beams B are sequentially focused on respective target portions C of the wafer W placed on the wafer table WT. Referring to FIG. 1, although the lithography apparatus LA is shown as including one wafer table WT and one second positioner PW, the inventive concept is not limited thereto. The lithography apparatus LA may include a plurality of wafer tables (for example, two wafer tables) and a plurality of second positioners (for example, two second positioners), and in this case, wafers placed on the different wafer tables may be alternately and sequentially exposed.

According to some embodiments, the second positioner PW may drive the wafer table WT to implement a designed circuit pattern on the wafer. According to some embodiments, the second positioner PW may drive the wafer table WT such that the beams B are focused on a set/predetermined position on the wafer W. The set/predetermined position on the wafer W may be defined from a model function calculated by using wafer alignment marks P1 and P2. Here, the model function is a function of positions identified by the wafer alignment marks P1 and P2, or a function regarding a position of an arbitrary component on the wafer W, the position being derived from the identified positions set forth above. The second positioner PW may drive the wafer table WT such that a layer formed on the wafer W by a lithography process is aligned with an underlying layer.

An integrated circuit may be manufactured by a series of patterning processes for a plurality of semiconductor material layers. Since a pattern newly formed in a subsequent layer (that is, an upper layer) is placed on a previous layer (that is, an underlying layer), the alignment of a new layer with respect to a previously formed circuit pattern may be beneficial in improving the yield of circuit formation and/or yield of semiconductor devices. Therefore, before performing exposure, differences between designed positions of arbitrary elements of the underlying layer and real positions thereof may be measured by using alignment marks.

According to some embodiments, a space between the projection system PL and the wafer W may be filled with a liquid having a high refractive index, such as water. In some cases, at least a portion of the wafer W may be covered with the liquid. The liquid may be referred to as an immersion liquid, and the immersion liquid may fill other spaces in the lithography apparatus LA, for example, a space between the patterning device MA and the projection system PL. Here, the immersion may mean not only that the wafer W is simply immersed in the liquid but also that the immersion liquid is placed on a path of the beams B for performing exposure.

The patterning device MA taken out from a mask library may be accurately moved by the first positioner PM and an additional position sensor such that the patterning device MA is located on the path of the beams B during the exposure process.

When the lithography apparatus LA is operated in a step mode, a whole pattern set in the beams B is projected onto the target portion C at once while the mask table MT and the wafer table WT are kept stopped/stationary. The patterning device MA may be aligned with the wafer W by using alignment marks M1 and M2 formed on the patterning device MA and the wafer alignment marks P1 and P2 formed on the wafer W. Here, the target portion C may include a full shot or a partial shot, which is described with reference to FIGS. 3 and 4. After the target portion C is exposed to a beam B patterned by the patterning device MA, the wafer table WT is moved in a direction parallel to the top surface of the wafer W such that another target portion C is exposed to the beam B (e.g., a light pattern). In the step mode, the maximum size of an exposure field defines the size of the target portion C exposed by a step shot.

Here, the exposure process is a process of partially changing properties of the photoresist material layer to provide a photoresist pattern having a set shape, e.g., a predetermined pattern. Here, the photoresist is a material performing a photochemical reaction when exposed to light and may include a positive photoresist and/or a negative photoresist. Although the positive photoresist is generally insoluble in a chemical material referred to as a photoresist developing solution, the positive photoresist may be changed to be soluble in the photoresist developing solution after exposed to a light. On the contrary, although the negative photoresist is soluble in the photoresist developing solution before exposed, the negative photoresist may be changed to be insoluble in the photoresist developing solution by the exposure process. Selective exposure of the photoresist material layer may be provided by the patterning device MA such as a photomask or the like. The patterning device MA may include a glass sheet partially covered with an opaque material such as chromium or the like and including a portion from which the opaque material has been removed, the portion corresponding to a circuit pattern. By projecting light having transmitted through the patterning device MA onto the photoresist material layer, a circuit pattern of one layer may be transferred to the photoresist material layer on the wafer W. In certain embodiments, the patterning device MA may include a reflective pattern and the reflective pattern may reflect light incident on the patterning device MA to the photoresist material layer.

When the lithography apparatus LA is operated in a scan mode, the mask table MT and the wafer table WT may make relative movements to each other in a synchronous manner while the beams B are projected onto the target portion C. The speed and direction of the relative movement of the wafer table WT with respect to the mask table MT may be determined by enlargement (or reduction) and image inversion properties of the projection system PL. In the scan mode, the maximum size of the exposure field may limit a horizontal width of the target portion C during the exposure.

Here, two directions, which are parallel to the top surface of the wafer W and substantially perpendicular to each other, are respectively referred to as first and second directions (X and Y directions). In addition, a direction, which is substantially perpendicular to the top surface of the wafer W, is referred to as a third direction (Z direction). Here, the first direction (X direction) and the second direction (Y direction) may be distinct from each other. For example, the second direction (Y direction) may be a direction in which scanning is performed in scanning-type exposure. The first direction (X direction) may be a direction that is substantially perpendicular to the direction in which scanning is performed. These descriptions are identically applied throughout the specification.

When the patterning device MA includes a programmable device such as a programmable mirror array or a programmable LCD panel, the beams B may be focused on the target portion C by moving or scanning the wafer table WT while the mask table MT is kept stopped/stationary during the exposure process. In this case, the beams B may be a pulsed source. The patterning device MA may be updated to set a new cross-section in the beams B according to the movement of the wafer table WT.

Referring again to FIGS. 1 and 2, after the process P20, before performing a development process, a post-exposure bake process may be optionally performed. The post-exposure bake process may be performed by the bake plate BK. The post-exposure bake process is an optional baking process for deriving an additional chemical reaction or the diffusion of a component inside a photoresist layer.

Next, in a process P30, the photoresist pattern may be formed. The photoresist pattern may be formed by a developer DE. The forming of the photoresist pattern is referred to as the development process. The development process is a process of removing an exposed or non-exposed portion of the photoresist material layer depending on the type of the photoresist material layer as described above.

Next, in a process P40, the wafer may be inspected. An inspection apparatus ID may perform inspection and measurement processes on the wafer. The inspection and measurement processes are processes of inspecting and measuring various properties of the photoresist pattern on the wafer. According to some embodiments, the inspection apparatus ID may measure or inspect the properties of the photoresist pattern, such as whether features included in the photoresist pattern have accurate sizes, shapes, and profiles, whether an overlay, which refers to consistency between a previous layer and the photoresist pattern, falls within an acceptable range, and/or whether there are defects in the photoresist pattern. For example, overlay may be a degree of alignment/misalignment between a pattern in an overlaying layer and a pattern in an underlying layer. According to some embodiments, the inspecting of the wafer may include measuring overlays such that an overlay distribution throughout the wafer is calculated, and calculating an overlay model function by using the measured overlays. For example, the overlay model function may be a function to adjust alignment between patterns formed in different layers, and the overlay model function may be considered an alignment function.

According to some embodiments, the inspection apparatus ID may determine exposure properties of respective wafers, and dispersions of the exposure properties between different layers of the same wafer, between different wafers, and/or between lots. According to some embodiments, although the inspection apparatus ID is shown as being included in the lithography cell LC, the inventive concept is not limited thereto. For example, the inspection apparatus ID may be included in the lithography apparatus LA or may be separate from the lithography cell LC and the lithography apparatus LA.

Figure 5A:
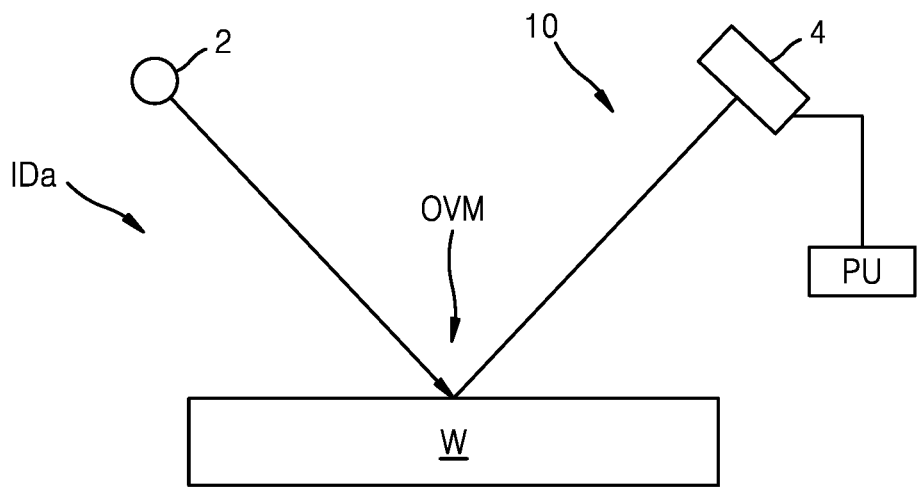
FIGS. 5A and 5B are schematic cross-sectional views respectively illustrating inspection apparatuses (for example, IDa and IDb) that may be included in a lithography cell, according to some embodiments.
Figure 5B:
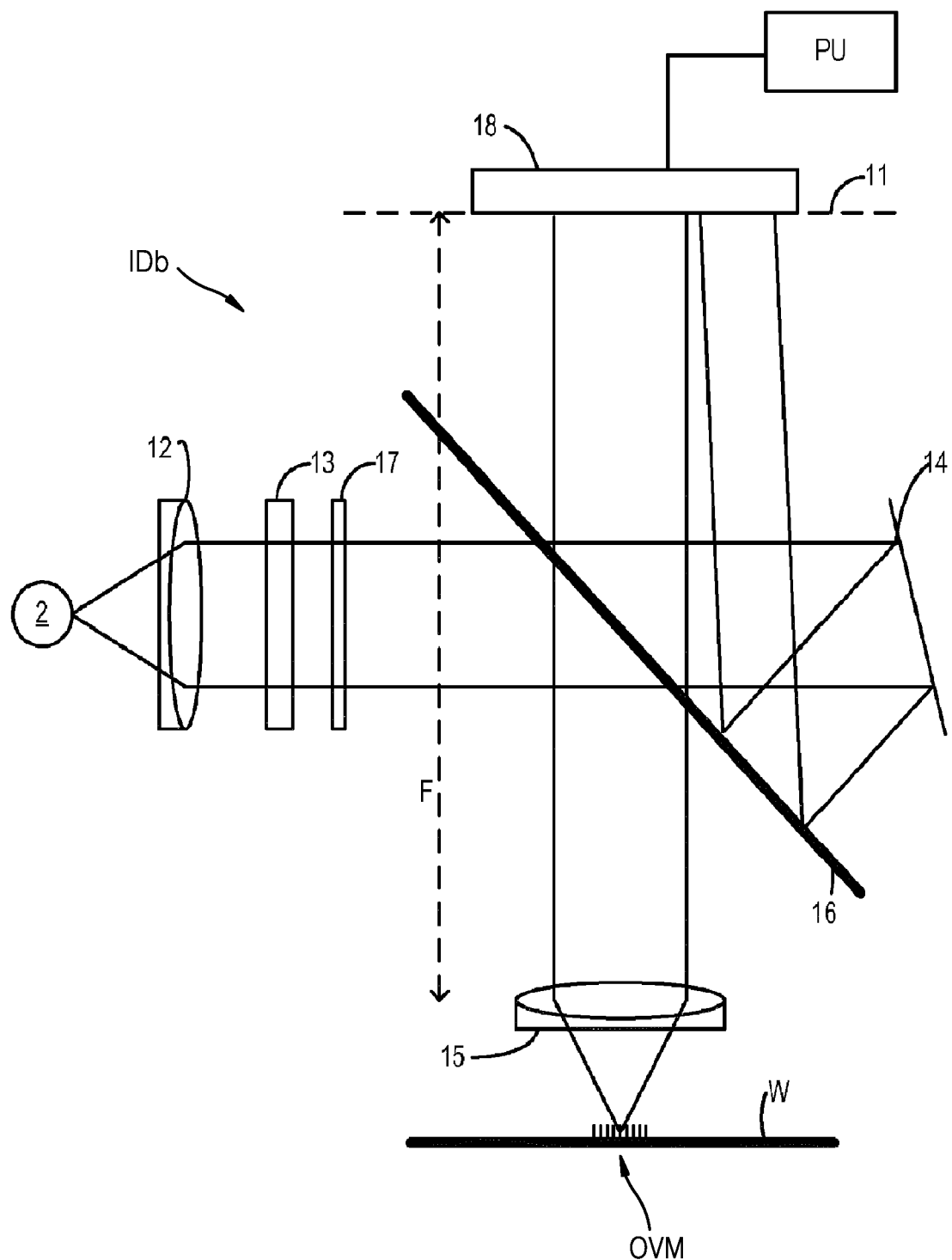

According to some embodiments, the inspection apparatus ID may include a scattering optical system shown in FIGS. 5A and 5B, without being limited thereto. For example, the inspection apparatus ID may include an image-based optical system. When the inspection apparatus ID includes a scattering optical system, an overlay, which refers to consistency between layers, may be measured by comparing magnitudes of first-order scattered lights. When the inspection apparatus ID includes an image-based optical system, the overlay may be measured by comparing a position of an overlay mark on the photoresist pattern with a position of an overlay mark of the underlying layer.

According to some embodiments, the inspection apparatus ID may inspect the photoresist material layer directly after exposure. A specific mechanism of obtaining an overlay will be described in more detail with reference to FIGS. 4 to 10.

Figure 4:
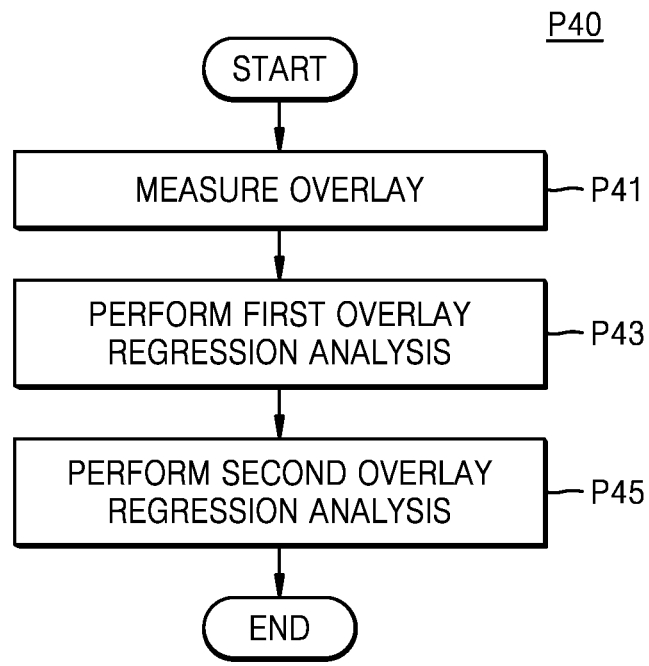
FIG. 4 is a flowchart illustrating the obtainment of an overlay, according to some embodiments.

FIG. 4 is a flowchart illustrating the obtainment of an overlay, according to some embodiments.

Referring to FIG. 4, the obtaining of an overlay in the process P40 may include measuring an overlay (P41), performing a first overlay regression analysis (P43), and performing a second overlay regression analysis (P45).

The measuring of an overlay in the process P41 may be performed by inspection apparatuses of FIGS. 5A and 5B.

FIGS. 5A and 5B are schematic cross-sectional views respectively illustrating inspection apparatuses IDa and IDb that may be included in a lithography cell, according to some embodiments.

Each of the inspection apparatuses IDa and IDb may correspond to the inspection apparatus ID shown in FIG. 2. For example, the inspection apparatus IDa in FIG. 5A may be of an oblique incidence type and the inspection apparatus IDb in FIG. 5B may be of a normal incidence type. Although FIGS. 5A and 5B respectively illustrate the inspection apparatuses IDa and IDb implemented by a scattering optical system, these are examples for descriptions and do not limit the inventive concept in any way. For example, the inspection apparatuses IDa and IDb may be image-based inspection apparatuses.

Referring to FIG. 5A, the inspection apparatus IDa may include a light source 2, a detector 4, and a processing unit PU.

According to some embodiments, the light source 2 may radiate a wide band (for example, white light) light onto the wafer W. According to some embodiments, the light source 2 may radiate light (electromagnetic wave) onto the top surface of the wafer W in an oblique direction. The light may be diffracted/scattered by an overlay mark OVM on the wafer W. Example layouts of the overlay mark OVM are illustrated in FIGS. 7A to 7C.

The processing unit PU may calculate, from a signal detected by the detector 4, structural properties of the overlay mark OVM causing the signal. For example, the processing unit PU may identify the structural properties of the overlay mark OVM from the signal reflected by the overlay mark OVM and detected by the detector 4. The calculation of the structural properties of the overlay mark OVM may be performed by wave analysis, non-linear regression, and/or comparison with a library of simulated spectra. Since a general shape (that is, a designed shape) of a profile of the overlay mark OVM is known and some parameters regarding structural changes may be derived from a manufacturing process, the structural properties of the overlay mark OVM may be calculated by using several parameters derived from scattering spectrum data.

Referring to FIG. 5B, the inspection apparatus IDb may include the light source 2, a collimating lens 12, an interference filter 13, a reference mirror 14, an objective lens 15, a splitter 16, a polarizer 17, a detector 18, and a processing unit PU. The processing unit PU of the inspection apparatus IDb in FIG. 5B may be the same as the processing unit PU of the inspection apparatus IDa of FIG. 5A. Light emitted from the light source 2 may be collimated by the collimating lens 12 and may transmit the interference filter 13 and the polarizer 17 to reach the splitter 16.

Some of the light reaching the splitter 16 may be reflected by the splitter 16 and focused on a surface of the wafer W by the objective lens 15. According to some embodiments, the objective lens 15 may have a numerical aperture of about 0.9 or more, about 0.95 or more, or about 1 or more, without being limited thereto.

The light reaching the wafer W may be scattered by the overlay mark OVM. The light scattered by the overlay mark OVM may reach the detector 18 through the splitter 16. The detector 18 may be arranged apart from the objective lens 15 by as much as a focal distance F of the objective lens 15, without being limited thereto. For example, the detector 18 may include a charge-coupled device (CCD) or an array of complementary metal-oxide-semiconductor (CMOS) sensors, without being limited thereto.

Reference light, which is light having transmitted through the splitter 16 after transmitting through the polarizer 17, may be used to measure, for example, the intensity of incident light. For example, the reference light may be used to determine the intensity of light coming from the overlay mark OVM, e.g., by comparing the intensity of light coming from the overlay mark OVM with the reference light. The reference light may be measured by another portion of the detector 18 or by a separate detector.

The interference filter 13 may include, for example, a band-pass filter capable of selectively transmitting wavelengths of about 405 nm to about 790 nm or about 200 nm to about 300 nm, without being limited thereto. According to some embodiments, a grating may be arranged instead of the interference filter 13. For example, the grating may be a diffraction grating.

According to some embodiments, the detector 18 may measure the intensity of scattered light having a single wavelength or a narrow wavelength band. According to some embodiments, the detector 18 may measure light having a plurality of wavelengths or a wide wavelength range. According to some embodiments, the detector 18 may measure a polarization angle of light.

Hereinafter, a wafer that is an inspection object, a full shot and partial shots, which divide the wafer, and overlay marks arranged in the full shot or the partial shots will be described with reference to FIGS. 6A to 8C.

Figure 6A:
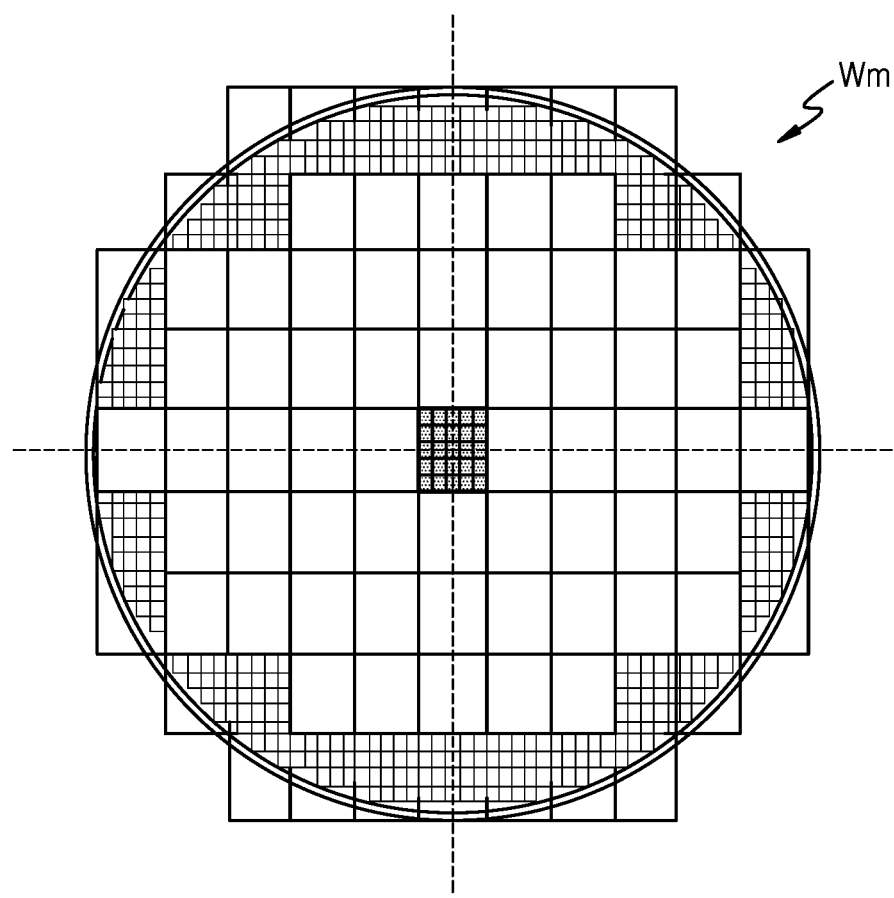
FIGS. 6A and 6B are plan views illustrating configurations of full shots and chips in a memory chip wafer and a logic chip wafer respectively. In particular.
Figure 6B:
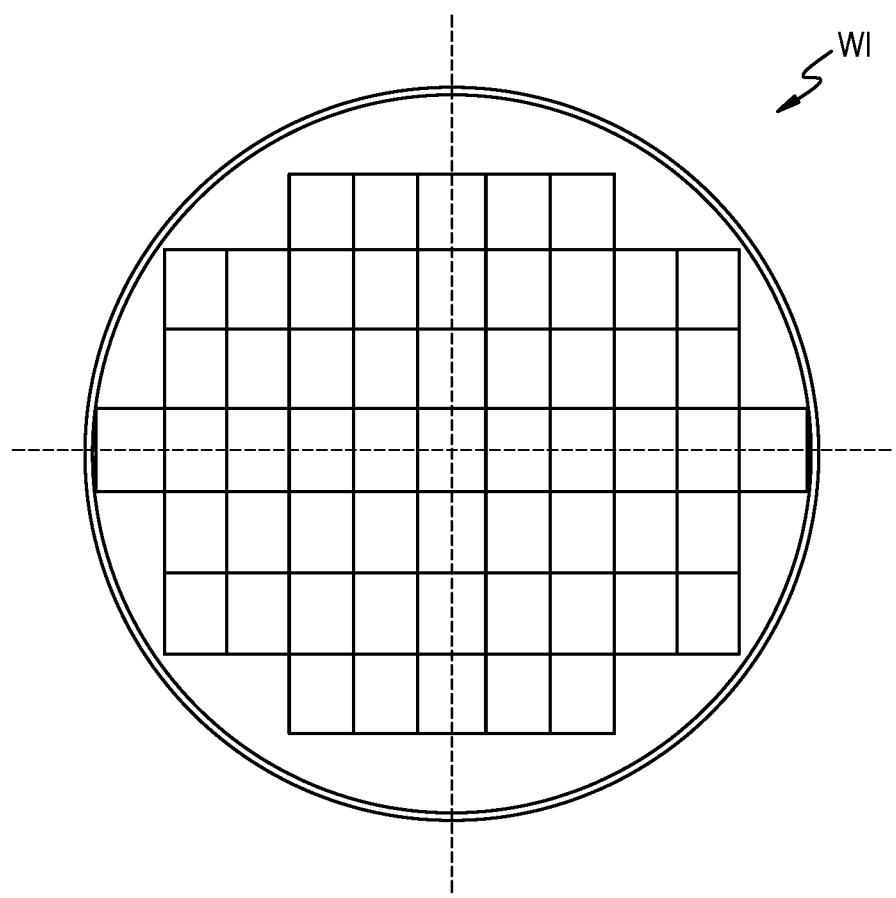

FIGS. 6A and 6B are plan views illustrating configurations of full shots and chips in a memory chip wafer and a logic chip wafer respectively. For example, FIG. 6A illustrates the memory chip wafer and FIG. 6B illustrates the logic chip wafer.

Referring to FIG. 6A, in a memory chip wafer Wm, one full shot may include a large number of memory chips. In FIG. 6A, a shot is shown as a large quadrangle and a memory chip is shown as a small quadrangle. For example, one full shot may include 25 memory chips. According to some embodiments, taking 87 shots or 87 times of scanning may be performed to pattern the entirety of one memory chip wafer Wm.

Among the 87 shots, there may be 57 full shots. Here, shots in an outer portion of the wafer Wm do not form a full shot. Thus, when an exposure process is performed on the outer portion of the wafer Wm, only a portion of a mask pattern may be transferred to the wafer Wm. Although a full shot is not transferred to the outer portion of the wafer Wm, a pattern required to implement a memory chip may be transferred thereto by partial transfer of a set pattern. Therefore, memory chips formed in the outer portion of the wafer Wm may also be used as valid chips in products.

Referring to FIG. 6B, in the case of the logic chip wafer Wl, one logic chip may correspond to one full shot. The logic chip wafer Wl may include 57 full shots. Unlike the memory chip wafer Wm, since an outer portion of the logic chip wafer Wl is not able to form one complete logic chip, exposure may not be performed on the outer portion of the logic chip wafer Wl.

Figure 7:
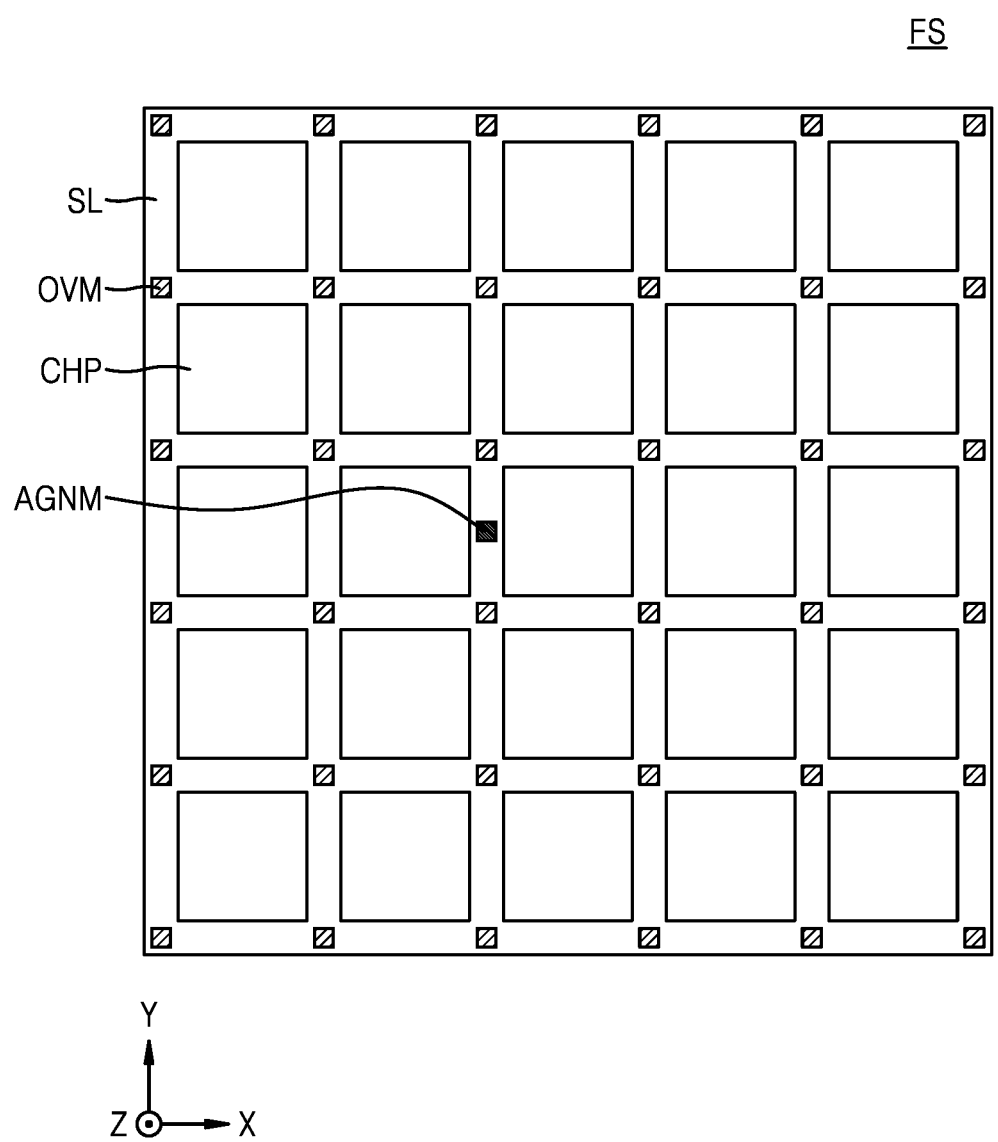
FIG. 7 is a plan view illustrating a diagram of a full shot FS in an extreme ultraviolet (EUV) exposure process.

FIG. 7 is a plan view illustrating a diagram of a full shot FS in an EUV exposure process.

The full shot FS in FIG. 7 may be for forming the memory chip shown in FIG. 6A. However, descriptions made with reference to FIG. 7 may be applied to both a wafer and a full shot for forming the logic chip in FIG. 6B in the same or a similar manner.

Referring to FIG. 7, the full shot FS in an exposure process may correspond to a whole mask pattern capable of being transferred by one scanning. Generally, an EUV exposure process may be performed by a reduction projection, for example, 4:1 reduction projection. Thus, patterns, such as a mask pattern, formed in a patterning device may be transferred to a wafer while reduced to ¼ sizes. Here, ¼ may indicate a reduction ratio of a length, and an area of the mask may be reduced to a 1/16 size on the wafer. According to some embodiments, the full shot FS may have a size of about 26 mm toward an X axis and about 33 mm toward a Y axis, without being limited thereto.

The full shot FS may include chips CHP and scribe lanes SL. The scribe lanes SL may extend respectively between the chips CHP and thus separate the chips CHP from each other. The scribe lanes SL may be separation lines for separating the chips CHP as individual semiconductor chips in a sawing process.

According to some embodiments, each chip CHP may include a memory device. According to some embodiments, each chip CHP may include a non-volatile memory device. According to some embodiments, each chip CHP may include a non-volatile NAND-type flash memory. According to some embodiments, each chip CHP may include one of phase-change random access memory (PRAM), magnetic RAM (MRAM), resistive RAM (ReRAM), ferroelectric RAM (FRAM), and NOR flash memory. In addition, each chip CHP may include a volatile memory device, such as dynamic RAM (DRAM) or static RAM (SRAM), which loses data when power is shut off.

Although FIG. 7 illustrates that 25 chips are formed in one full shot FS, this is merely an example for descriptions and does not limit the inventive concept in any way. One full shot FS may include various numbers of chips having various sizes depending upon kinds and specifications of devices intended to be formed, and this is also applied to FIG. 3.

According to some embodiments, for example, each chip CHP may include or may be one of a logic chip, a measurement device, a communication device, a digital signal processor (DSP), and a system-on-chip (SOC).

In addition, although FIG. 7 illustrates that each chip CHP approximately has a square profile, the inventive concept is not limited thereto. For example, each chip CHP may include a driver IC chip, and in this case, sides opposite to each other in one direction may be longer than sides opposite to each other in another direction that is perpendicular to the one direction. For example, the chips CHP included in the shot may be oblong in certain embodiments.

According to some embodiments, an alignment mark AGNM and overlay marks OVM may be further formed in the full shot FS. According to some embodiments, although the alignment mark AGNM and the overlay marks OVM are shown as being formed in the scribe lanes SL, the inventive concept is not limited thereto. For example, some of the alignment mark AGNM and the overlay marks OVM may be formed in the chips CHP.

According to some embodiments, the alignment mark AGNM may be a pattern used to accurately set an exposure region in lithography. According to some embodiments, the alignment mark AGNM may be arranged adjacent to a central portion of the full shot FS, without being limited thereto. Referring to FIG. 7, although one full shot FS is shown as including one alignment mark AGNM, the inventive concept is not limited thereto. For example, in some full shots FS, two or more alignment marks AGNM may be arranged. In addition, in some full shots FS, the alignment mark AGNM may be omitted. According to some embodiments, the alignment mark AGNM may be identical to the wafer alignment marks P1 and P2 described with reference to FIG. 1.

According to some embodiments, the overlay marks OVM may be patterns for measuring interlayer consistency between a layer formed in a previous process and a layer formed in a current process (e.g., a following process). Here, the interlayer consistency may include, for example, an alignment state between adjacent layers, the generation or not of circuit faults such as short-circuit and open-circuit, and the like. According to some embodiments, the overlay marks OVM may be arranged at a higher density than the alignment mark AGNM.

In the full shot FS, marks having various functions may be additionally provided. For example, a mark for an electrical test of properties of a completed semiconductor device, a mark for measuring the thickness of an uppermost layer after a chemical mechanical polishing (CMP) process, a mark for measuring a critical line width or an internal thickness in an optical manner, or the like may be additionally provided to the full shot FS.

Figure 8A:
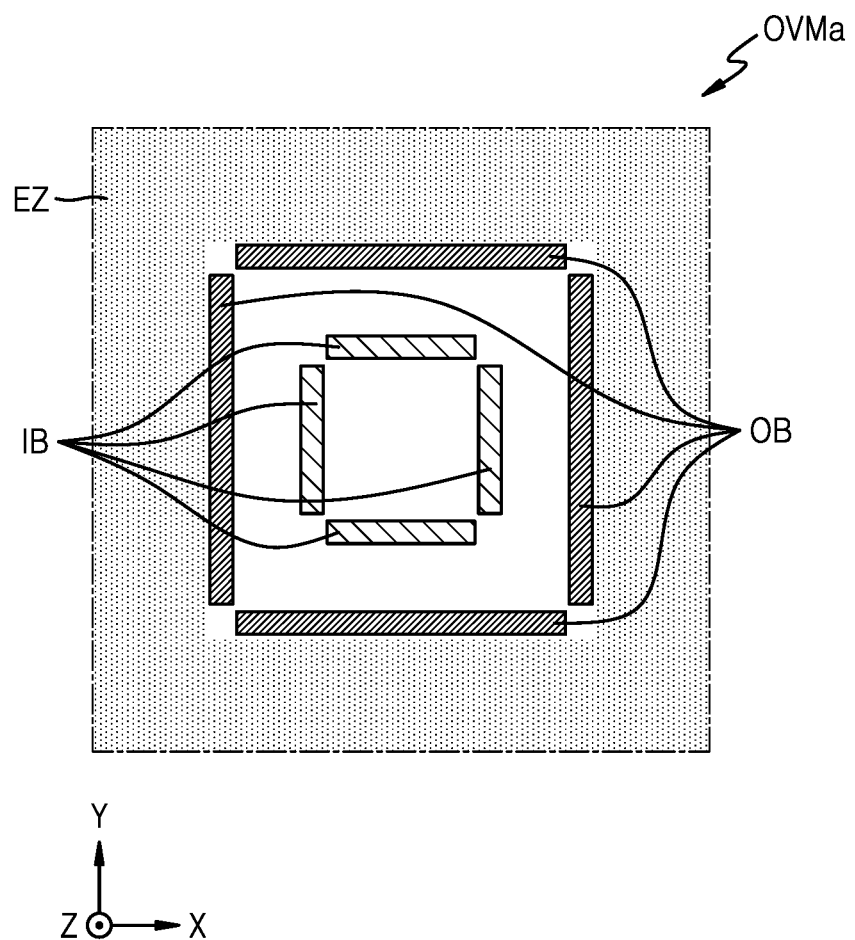
FIGS. 8A to 8C are layout diagrams respectively illustrating overlay marks that may be used for a method of manufacturing a semiconductor device, according to some embodiments.
Figure 8B:
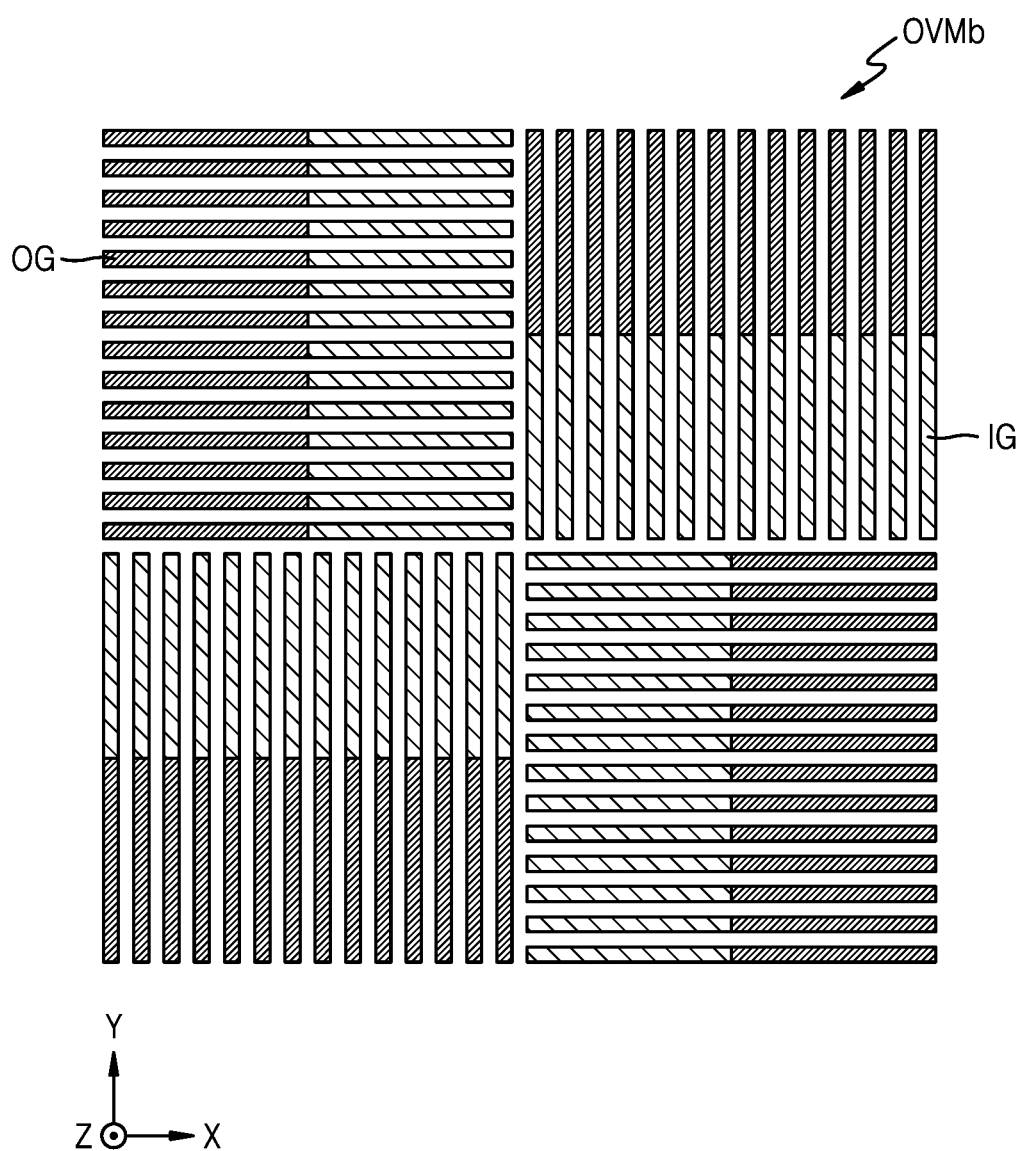
Figure 8C:
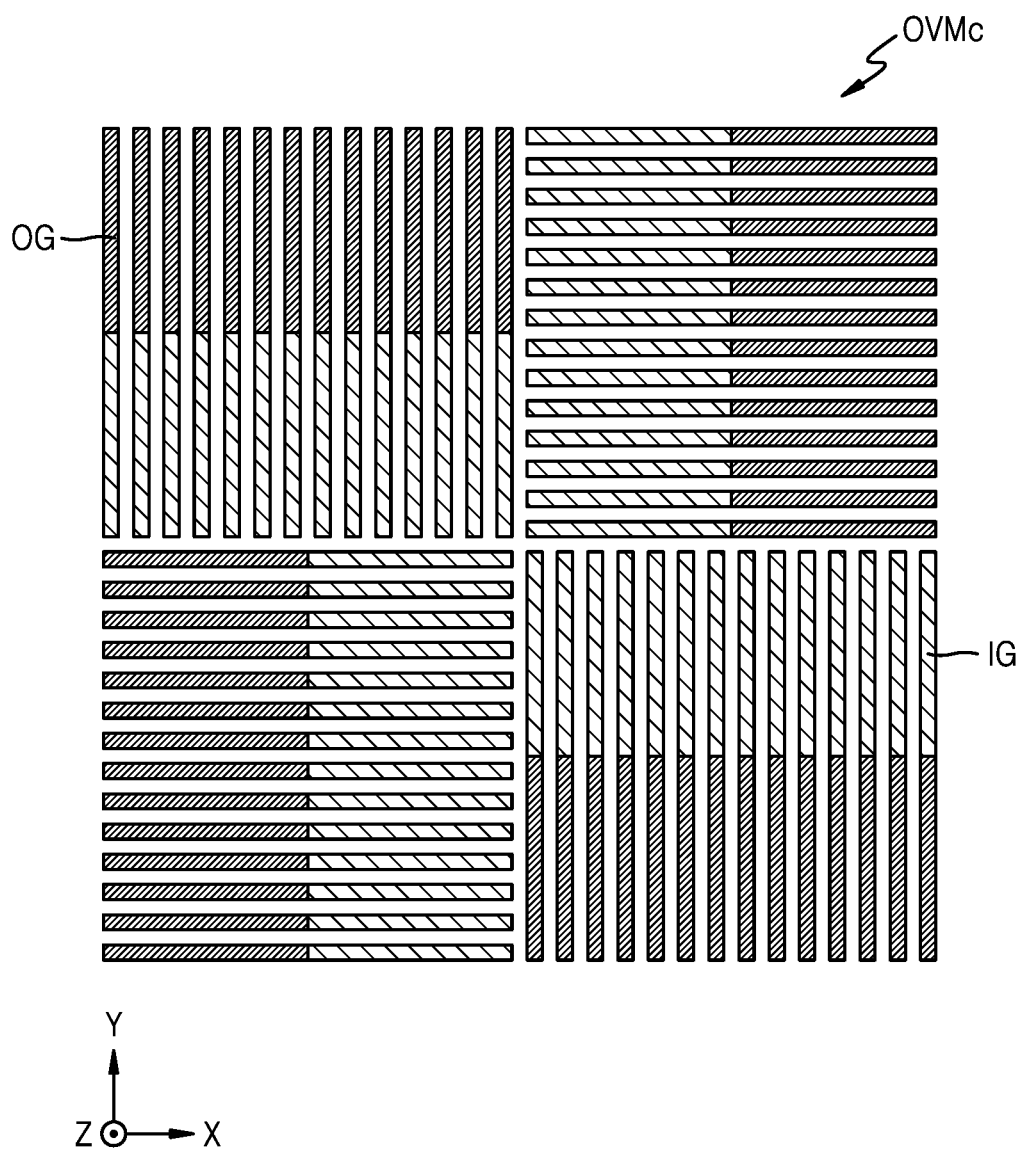

FIGS. 8A to 8C are layout diagrams respectively illustrating overlay marks OVMa, OVMb, and OVMc, which may be used for a method of manufacturing a semiconductor device, according to some embodiments. Each overlay mark OVM in FIG. 7 may be identical to one of the overlay marks OVMa, OVMb, and OVMc respectively shown in FIGS. 8A to 8C, without being limited thereto.

Referring to FIG. 8A, the overlay mark OVMa may include a box-in-box structure as shown in FIG. 8A.

The overlay mark OVMa may include an inner box IB, an outer box OB, and an exclusion zone EZ. According to some embodiments, the outer box OB may be formed in a semiconductor layer, in which a circuit pattern is formed, and the inner box IB may be formed in a photoresist pattern, without being limited thereto. For example, the inner box IB may be formed in the semiconductor layer, in which the circuit pattern is formed, and the outer box OB may be formed in the photoresist pattern.

According to some embodiments, each of the inner box IB and the outer box OB may include four line patterns arranged at respective sides of a quadrangle. According to some embodiments, patterns constituting each of the inner box IB and the outer box OB may be arranged to form an approximate quadrangle, without being limited thereto. For example, the inner box IB may be inside the outer box OB as shown in FIG. 8A.

According to some embodiments, the exclusion zone EZ is a region used/beneficial to perform normal overlay measurement by the overlay mark OVMa and may surround the inner box IB and the outer box OB. The exclusion zone EZ may be formed in each of the semiconductor layer, in which the circuit pattern is formed, and the photoresist pattern.

According to some embodiments, each of the inner box IB and the outer box OB may include a material that is optically distinct from a semiconductor, conductive, or insulating material adjacent thereto. According to some embodiments, each of the inner box IB and the outer box OB may include one of a semiconductor material, a conductive material, and an insulating material.

The inner box IB and the outer box OB may be designed such that centers of symmetry thereof are consistent with each other. For example, the center of symmetry of the inner box IB and the center of symmetry of the out box OB may be the same. According to some embodiments, an overlay may be measured from a measurement image of the overlay mark OVMa by using a deviation between the center of the inner box IB and the center of the outer box OB. For example, the overlay may be measured by comparing relative positions between the inner box IB and the outer box OB.

Referring to FIGS. 8B and 8C, each of the overlay marks OVMb and OVMc may include a grating structure including an outer grating OG and an inner grating IG. According to some embodiments, the outer grating OG may be formed in a semiconductor layer, in which a circuit pattern is formed, and the inner grating IG may be formed in a photoresist pattern, without being limited thereto. For example, the inner grating IG may be formed in the semiconductor layer, in which the circuit pattern is formed, and the outer grating OG may be formed in the photoresist pattern.

For example, the outer grating OG may be included in the semiconductor layer, in which the circuit pattern is formed, and the inner grating IG may be included in the photoresist pattern, without being limited thereto. For example, the inner grating IG may be included in the semiconductor layer, in which the circuit pattern is formed, and the outer grating OG may be included in the photoresist pattern.

The overlay mark OVMb having a grating shape may include 8 octants and may be characterized by the inner and outer gratings IG and OG and chirality thereof. Here, each of the overlay marks OVMb and OVMc in FIGS. 8B and 8C may be symmetric under a 90° rotation. On the other hand, the overlay marks OVMb and OVMc in FIGS. 8B and 8C may be mirror-image symmetric to each other. For example, the overlay marks OVMb and OVMc in FIGS. 8B and 8C may have distinct structures having different shapes from each other even though rotated by as much as an arbitrary angle in the first and second directions (X and Y directions). Each of the overlay marks OVMb and OVMc having grating shapes may not include an exclusion zone, and since each of the overlay marks OVMb and OVMc includes patterns arranged more densely than an overlay mark having a box-in-box shape, more information may be obtained from the overlay marks OVMb and OVMc through overlay measurement than from the box-in-box overlay mark.

Referring to FIGS. 4 and 7, in the process P43, the first overlay regression analysis may be performed. According to some embodiments, the overlay marks OVM may be arranged in a finite number at discrete positions on a wafer. According to some embodiments, consecutive overlay values throughout the wafer may be calculated by applying a known fitting technique to overlay information measured from the overlay marks OVM. According to some embodiments, the first overlay regression analysis may include regressively analyzing first and second-direction (X and Y-direction) overlays, which are measured from each of the overlay marks OVM, by taking a polynomial function as a basis. According to some embodiments, the first overlay regression analysis may include regressively analyzing the first and second-direction (X and Y-direction) overlays by using a first or lower-order basis, e.g., first order and/or zeroth order basis. An overlay regression analysis may include regressively analyzing overlays by using offset components and magnification components.

A first-direction (X-direction) first overlay model function, that is, dx1, and a second-direction (Y-direction) first overlay model function, that is, dy1, which are calculated by the first overlay regression analysis, may be represented by Mathematical Expression 1.

$$dx1 = k1 + k3 \cdot x + k5 \cdot y$$

$$dy1 = k2 + k4 \cdot x + k6 \cdot y \qquad \text{[Mathematical Expression 1]}$$

wherein x is a position coordinate in the first direction (X direction); y is a position coordinate in the second direction (Y direction); and k1 to k6 are proportional constants determined by the first overlay regression analysis. For example, the first overlay model function may include a constant term, e.g., k1 or k2.

According to some embodiments, the determination of k1 to k6 may be performed by the least square method. According to some embodiments, the first overlay regression analysis may include determining k1 to k6 such that deviations between overlay values measured by each overlay mark OVM and values of the first overlay model functions represented by Mathematical Expression 1 are minimized. For example, the first overlay regression analysis may include determining k1 to k6 such that respective expressions included in Mathematical Expression 2 are minimized.

$$\sum_i (dx_i - dx1(i))^2 \qquad \text{[Mathematical Expression 2]}$$

$$\sum_i (dy_i - dy1(i))^2$$

wherein $dx_i$ and $dy_i$ are overlay values of an i-th overlay mark OVM on the wafer in the first and second directions (X and Y directions), respectively; i is an ordinal number for identifying different marks on the wafer; and dx1(i) and dy1(i) are values of the first overlay model functions calculated by the position coordinates of the i-th overlay mark OVM, respectively.

Next, in the process P45, the second overlay regression analysis may be performed. The second overlay regression analysis may include regressively analyzing overlay differences, which are differences between overlay measurement values and the first overlay model functions. A first-direction (X-direction) overlay difference, that is, $\Delta x_i$, and a second-direction (Y-direction) overlay difference, that is, $\Delta y_i$, may be respectively defined by Mathematical Expression 3, from dx1 and dy1 represented by Mathematical Expression 1 and $dx_i$ and $dy_i$ measured from the overlay marks OVM.

$$\Delta x_i = dx_i - dx(i)$$

$$\Delta y_i = dy_i - dy(i) \qquad \text{[Mathematical Expression 3]}$$

The second overlay regression analysis may include calculating consecutive overlay difference values throughout the wafer from discrete overlay difference values respectively corresponding to the overlay marks OVM. According to some embodiments, the second overlay regression analysis may include regressively analyzing the first and second-direction (X and Y-direction) overlay differences, that is, $\Delta x_i$ and $\Delta y_i$. According to some embodiments, the second overlay regression analysis may include regressively analyzing the first and second-direction (X and Y-direction) overlay differences, that is, $\Delta x_i$ and $\Delta y_i$, by using a second or higher-order basis.

According to some embodiments, a first-direction (X-direction) second overlay model function, that is, dx2, and a second-direction second overlay model function, that is, dy2, which are calculated by the second overlay regression analysis, may be represented by Mathematical Expression 4.

$$dx2 = k7x^2 + k9 \cdot xy + k11 \cdot y^2 + k13x^3 + k15x^2y + k17xy^2 + k19y^3$$

$$dy2 = k8x^2 + k10 \cdot xy + k12 \cdot y^2 + k14x^3 + k16x^2y + k18xy^2 + k20y^3 \qquad \text{[Mathematical Expression 4]}$$

wherein k7 to k20 are proportional constants determined by the second overlay regression analysis.

According to some embodiments, the determination of k7 to k20 may be performed by, for example, the least square method. According to some embodiments, the second overlay regression analysis may include determining k7 to k20 such that deviations between overlay differences, that is, $\Delta x_i$ and $\Delta y_i$, which correspond to each overlay mark OVM, and the second overlay model functions corresponding thereto are minimized. For example, the second overlay regression analysis may include determining k7 to k20 such that respective expressions included in Mathematical Expression 5 are minimized.

$$\sum_i [\Delta x_i - dx2(i)]^2 \quad \text{[Mathematical Expression 5]}$$

$$\sum_i [\Delta y_i - dy2(i)]^2$$

wherein dx2(i) and dy2(i) are values of the second overlay model functions calculated by the position coordinates of the i-th overlay mark OVM, respectively.

Therefore, each of first and second-direction (X and Y-direction) combined overlay model functions, that is, dxc and dyc, for calculating overlay information for components throughout the wafer may be a sum of the first and second overlay model functions. For example, the combined overlay model functions may be represented by Mathematical Expression 6.

$$dxc = dx1 + dx2$$

$$dyc = dy1 + dy2 \quad \text{[Mathematical Expression 6]}$$

According to some embodiments, the first overlay regression analysis, which is an overlay regression analysis by first-order terms, is performed first, whereby the magnitude of third-order terms having high correlations with the first-order terms may be minimized. In addition, the second overlay regression analysis, which is an overlay regression analysis by higher-order terms, e.g., by second or higher-order terms, is performed, whereby the reliability of overlays may be secured. In a lithography process, the correction for the third-order terms upon exposure is limited or virtually impossible. For example, when refractive-type exposure with DUV is performed, since a third-order term (that is, $x^3$) in the first direction (X direction) is corrected by the distortion of a lens using pressure, the maximum correctable magnitude is small and thereby accuracy may be deteriorated. In some cases, the correction of a third-order term (that is, $y^3$) in the second direction (Y direction), which is a scan direction, may be performed by adjusting a scanning speed. When reflective-type exposure with DUV is performed, it may be virtually impossible to correct the third-order term in the first direction (X direction). According to some embodiments, the relative magnitude of the third-order terms is decreased by increasing the relative magnitude of the first-order terms having high correlations with the third-order terms, whereby the easy modification and reliability of an exposure process may be improved.

Although the first overlay regression analysis has been described above as being performed by first or lower-order terms, the inventive concept is not limited thereto. For example, a first-direction (X-direction) first overlay model function, that is, dx1', and a second-direction (Y-direction) first overlay model function, that is, dy1', may be configured by a second or lower-order polynomial. The first-direction (X-direction) first overlay model function, that is, dx1', and the second-direction (Y-direction) first overlay model function, that is, dy1', may be represented by Mathematical Expression 7.

$$dx1' = k1' + k3' \cdot x + k5' \cdot y + k7' \cdot x^2 + k9' \cdot xy + k11' \cdot y^2$$

$$dy1' = k2' + k4' \cdot x + k6' \cdot y + k8' \cdot x^2 + k10' \cdot xy + k12' \cdot y^2 \quad \text{[Mathematical Expression 7]}$$

wherein k1' to k12' are constants determined by the first overlay regression analysis and may be determined by the least square method, as described above. For example, the highest-order term of the first overlay model function may be second order.

Next, a first-direction (X-direction) second overlay model function, that is, dx2', and a second-direction (Y-direction) second overlay model function, that is, dy2', which are calculated by the second overlay regression analysis, may be represented by Mathematical Expression 8.

$$dx2' = k13' x^3 + k15' x^2 y + k17' xy^2 + k19' y^3$$

$$dy2' = k14' x^3 + k16' x^2 y + k18' xy^2 + k20' y^3 \quad \text{[Mathematical Expression 8]}$$

wherein k13' to k20' are constants determined by the second overlay regression analysis and may be determined by the least square method, as described above.

Referring to Mathematical Expressions 7 and 8, the first overlay model functions may be regressively analyzed by second or lower-order terms and the second overlay model functions may be regressively analyzed by third or higher-order terms. According to some embodiments, a correlation of a first-order term with a second-order term may be relatively low, unlike with a third-order term. For example, since a correlation between $x^2$ and x is lower than a correlation between $x^3$ and x, even when regression analyses of the first-order and second-order terms are simultaneously performed, a coefficient of the first-order term having a high correlation with the third-order term may have a relatively large value. According to some embodiments, a first regression analysis of the second or lower-order terms may be performed first, thereby reducing the magnitude of the third or higher-order terms. Therefore, the reliability of the exposure process may be improved.

Figure 9:
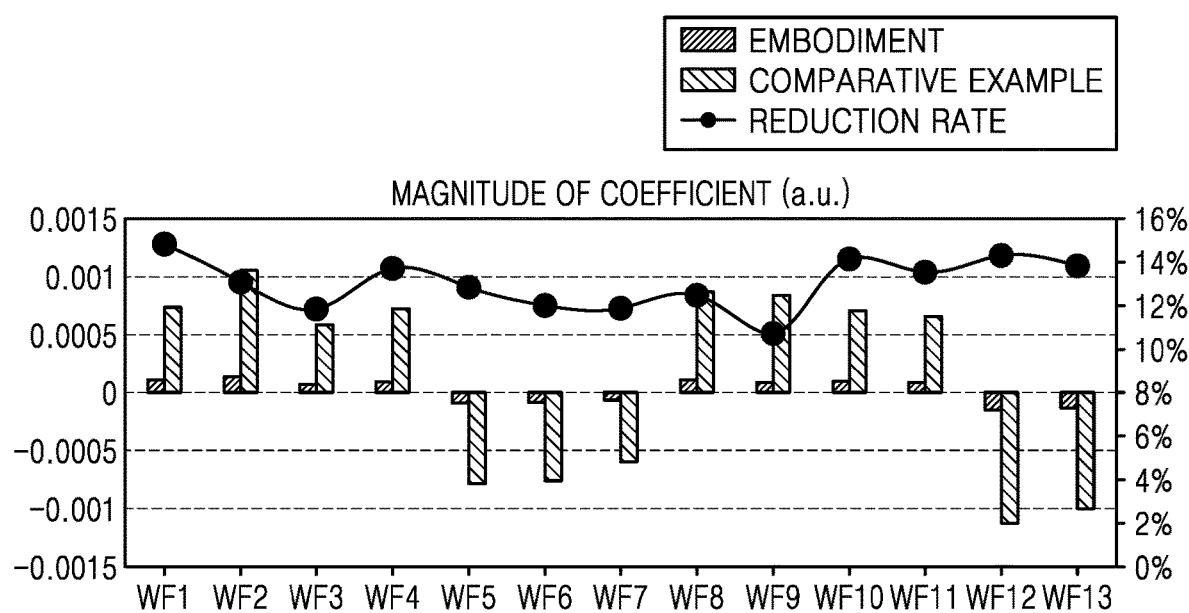
FIGS. 9 to 10B are graphs each depicting effects of the obtainment of overlays, according to some embodiments.
Figure 10A:
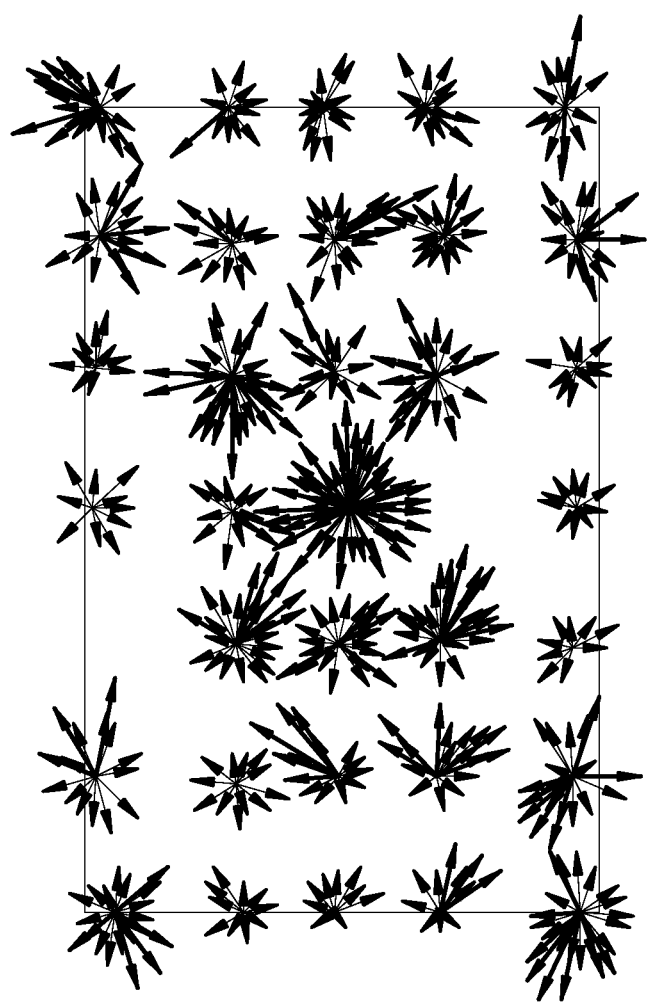
Figure 10B:
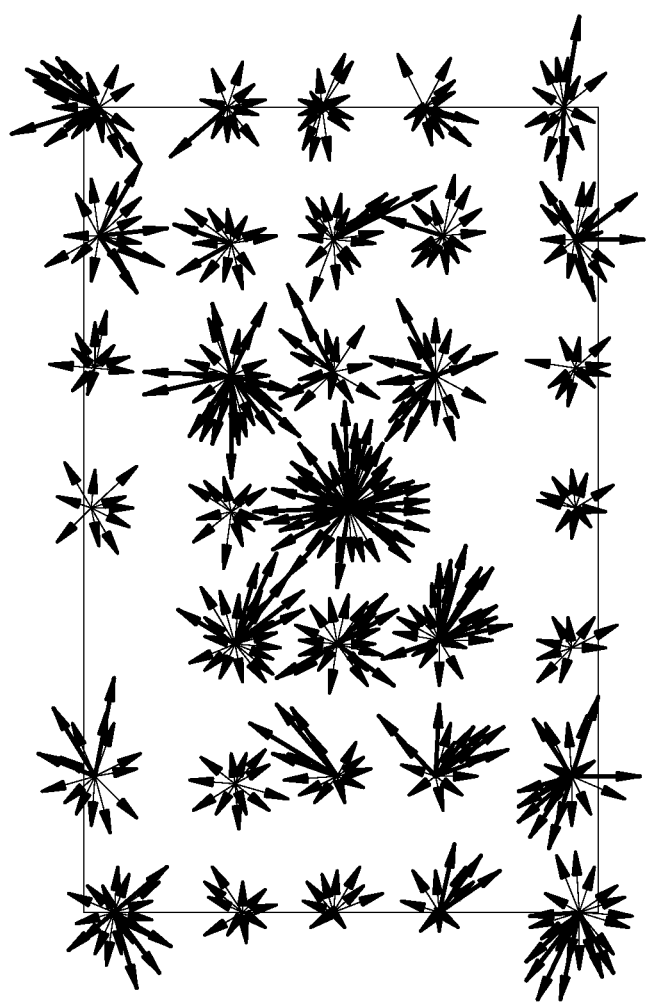

FIGS. 9 to 10B are graphs each depicting effects of the obtainment of overlays, according to some embodiments.

Referring to FIG. 9, the magnitude of a coefficient of $x^3$ for each wafer, which is calculated by an overlay regression analysis of a comparative example, is shown. The horizontal axis denotes different wafers included in one lot, and the vertical axis denotes the magnitude of a coefficient in an arbitrary unit.

Referring to FIG. 9, according to an overlay regression analysis according to some embodiments, it is shown that the magnitude of the coefficient of $x^3$ for each wafer was reduced by 10% or more from that of the comparative example.

Referring to FIG. 10A, an overlay residual map simulated according to the comparative example is shown. In addition, referring to FIG. 10B, an overlay residual map simulated according to some embodiments is shown.

Characteristic values of overlays according to the comparative example and embodiments are shown in Table 1.

TABLE 1

| Item | x_m + 3σ | y_m + 3σ | x_th | y_th |
|---|---|---|---|---|
| Comparative Example | 3.4 | 3.0 | 3.9 | 3.4 |
| Embodiments | 3.5 | 3.0 | 3.9 | 3.6 |

In Table 1, x_m+3σ refers to a value obtained by adding an average of first-direction (X-direction) overlays to three times the standard deviation thereof, and y_m+3σ refers to a value obtained by adding an average of second-direction (Y-direction) overlays to three times the standard deviation thereof. x_th and y_th are first and second-direction (X and Y-direction) overlay values corresponding to 3-sigma (that is, three times the standard deviation) in Gaussian distributions, respectively. For example, when there are 1000 overlay values, each of x_th and y_th is the 997-th smallest overlay value thereamong.

Referring to FIGS. 10A and 10B and Table 1, it is shown that the overlay regression analysis according to some embodiments provides the same level of accuracy as the overlay regression analysis according to the comparative example.

For example, according to some embodiments, the overlay regression analysis, which has the same level of accuracy as that of the related art while significantly reducing the coefficient of $x^3$, may be provided.

Referring again to FIG. 1, in a process P50, the lithography process may be evaluated. According to some embodiments, the evaluation of the lithography process may include comparing an overlay value with an acceptable threshold value.

As a result of the evaluation of the lithography process, when a photoresist pattern is formed well (G), that is, when an overlay is equal to or less than the acceptable threshold value, etching, ion implantation, and/or deposition processes, which are subsequent processes, may be performed in a process P60. When the photoresist pattern is not good (NG), that is, when the overlay is greater than the acceptable threshold value, the subsequent processes may not be performed. Therefore, the photoresist pattern may be removed in a process P55, followed by returning to the process P10, whereby the photoresist material layer may be provided again. According to some embodiments, the photoresist material layer may be provided again by returning to the process P10, followed by performing the alignment and exposure processes in the process P20, and then, the photoresist pattern may be formed in the process P30. Here, the performing of the alignment and exposure processes in the process P20 may rely on a result of wafer inspection performed on the same wafer. For example, the alignment and exposure processes in the process P20 may undergo overlay compensation by an overlay model function value for the same wafer. For example, the alignment and exposure processes P20 may be compensated by the overlay model function obtained in the previous process before performing the following alignment and exposure processes P20. Therefore, since an overlay in a lithography process performed again is improved, the reliability and manufacturing yield in the manufacture of the semiconductor device may be improved.

Figure 11:
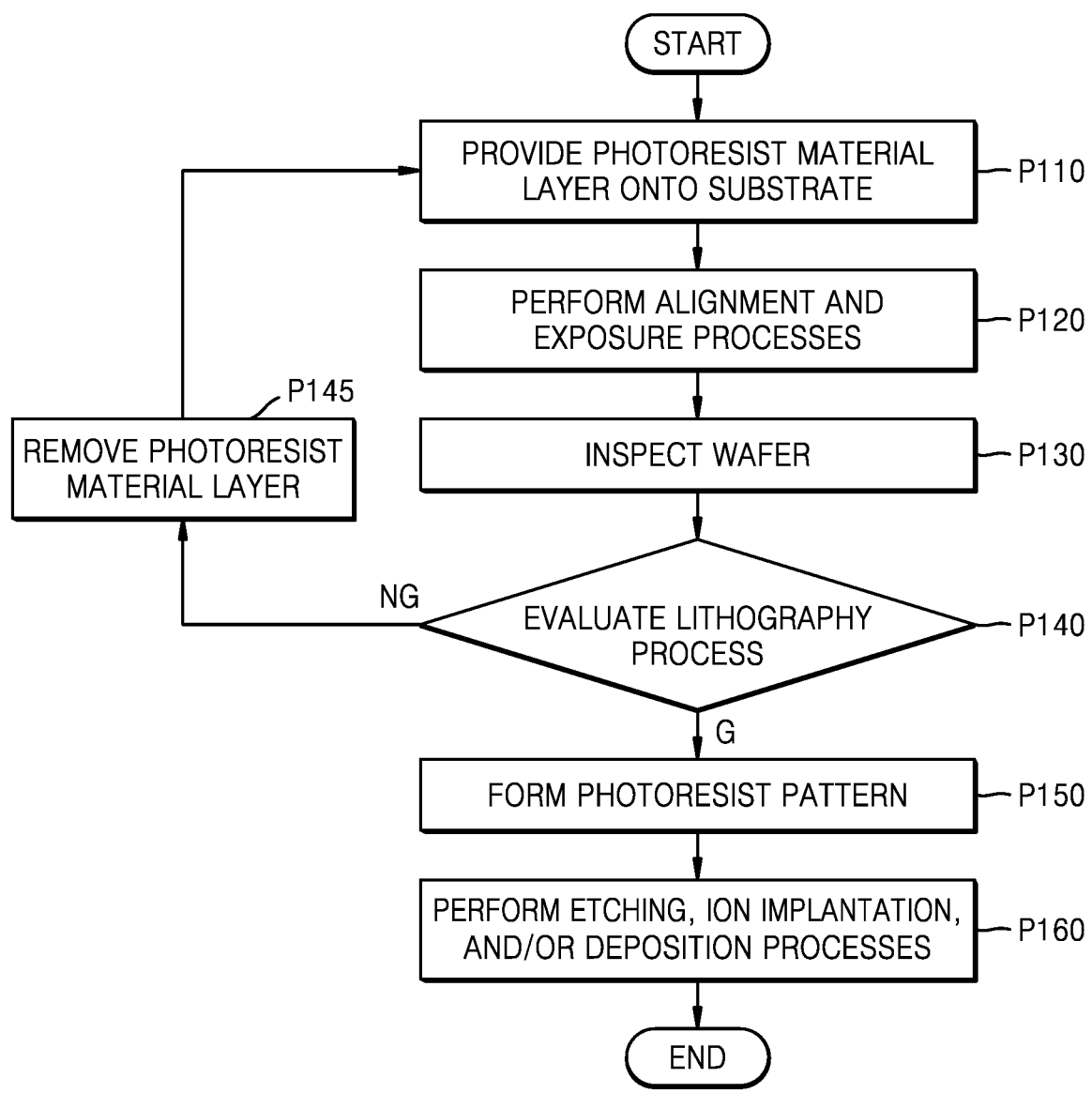
FIGS. 11 to 14 are flowcharts each illustrating a method of manufacturing a semiconductor device, according to some embodiments.
Figure 12:
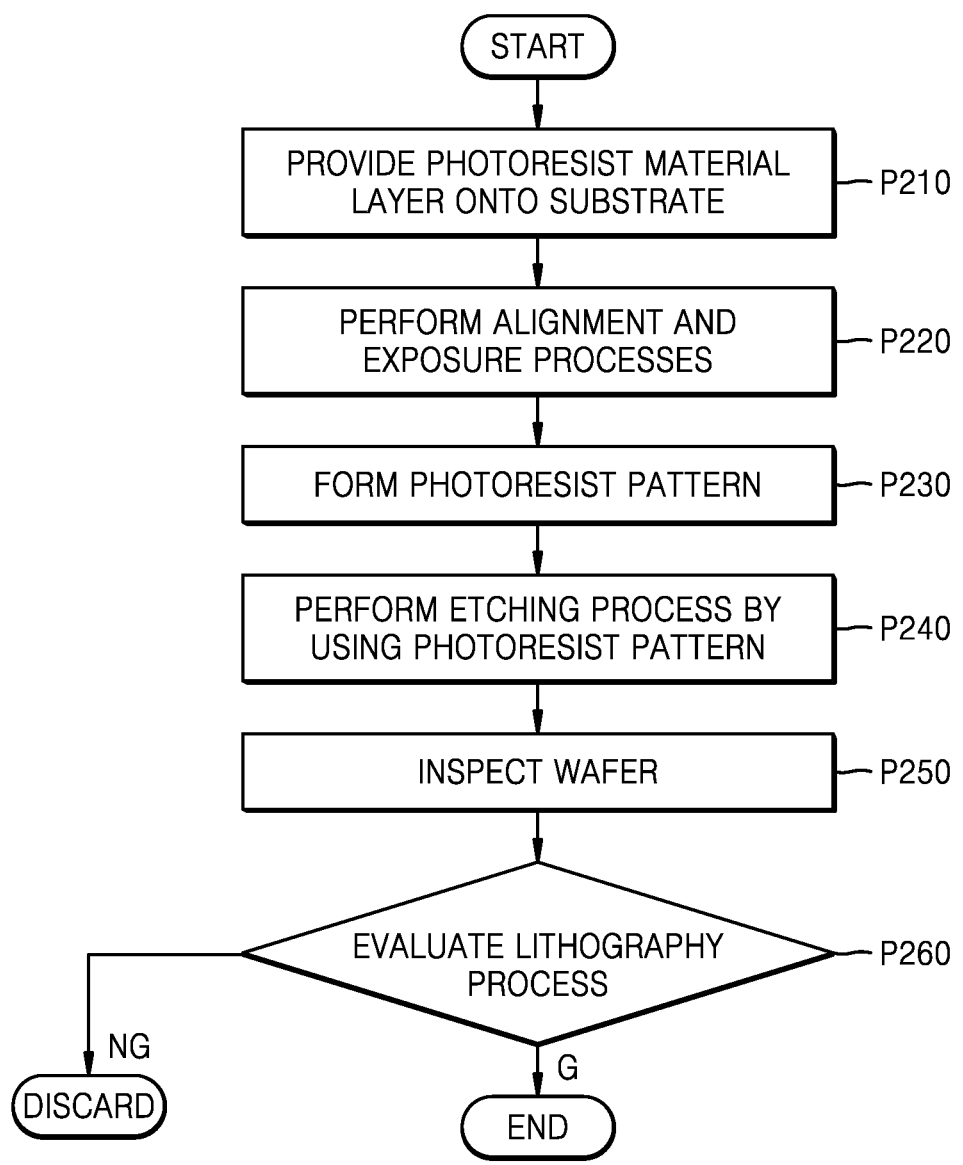

FIGS. 11 and 12 are flowcharts each illustrating a method of manufacturing a semiconductor device, according to some embodiments.

For convenience, repeated descriptions made with reference to FIGS. 1 to 10 will be omitted and differences will be mainly described.

Referring to FIG. 11, processes P110 and P120 may be identical to the processes P10 and P20 in FIG. 1, respectively.

According to some embodiments, in a process P130, a wafer may be inspected. According to some embodiments, the inspecting of the wafer may include obtaining an overlay of a photoresist material layer before development, after exposure. Here, a difference in refractive index between exposed portions and non-exposed portions of the photoresist material layer may be extremely small. Thus, a latent image of the photoresist material layer before development has an extremely low contrast. According to some embodiments, before the inspection, the contrast between the exposed portions and the non-exposed portions of the photoresist material layer may be increased by a post-exposure bake process.

The inspection of the wafer in the process P130 may be identical to the inspection of the wafer in the process P40. As the inspection of the wafer in the process P130 is performed, an overlay between the latent image formed in the photoresist material layer and a semiconductor layer, in which a circuit pattern has been already formed, may be obtained.

Next, in a process P140, the lithography process may be evaluated. The evaluation of the lithography process may include comparing the overlay with an acceptable threshold value.

When the overlay is equal to or less than the acceptable threshold value (G), a photoresist pattern may be formed by a development process in a process P150, and etching, ion implantation, and/or deposition processes may be performed in a process P160.

When the overlay is greater than the acceptable threshold value (NG), the photoresist material layer may be removed in a process P145, and the processes P110 to P130 may be performed again. For example, the same or identical photomask and/or photomask pattern may be used to expose photoresist material layers before and after the process P145.

Referring to FIG. 12, processes P210 to P230 may be identical to the processes P10 to P30 described with reference to FIG. 1, respectively.

Next, in a process P240, a layer placed under a photoresist pattern may be etched by using the photoresist pattern.

Next, in a process P250, a wafer may be inspected. The inspection of the wafer in the process P250 may be identical to the inspection of the wafer in the process P40.

Next, in a process P260, a lithography process may be evaluated. The evaluation of the lithography process may include comparing an overlay with an acceptable threshold value.

When the overlay is equal to or less than the acceptable threshold value (G), the lithography process may be terminated and a subsequent process may be performed. When the overlay is greater than the acceptable threshold value (NG), since the etching process has been performed, the wafer may be discarded.

Figure 13:
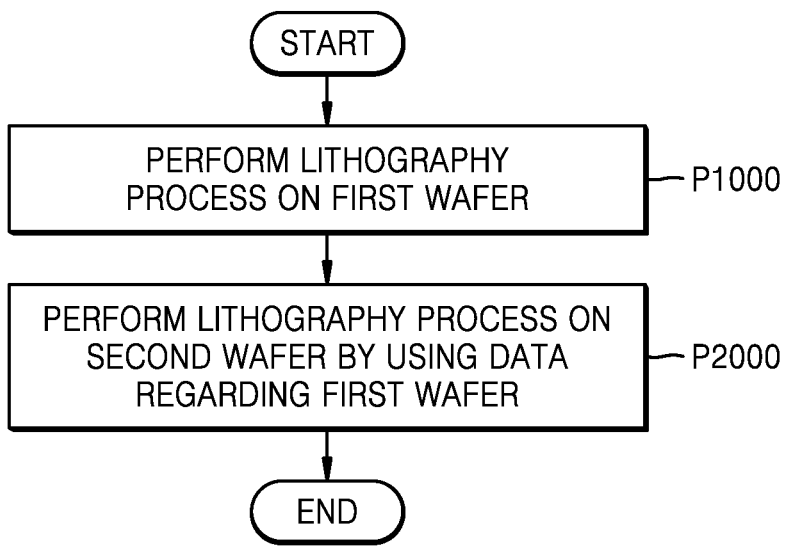
Figure 14:
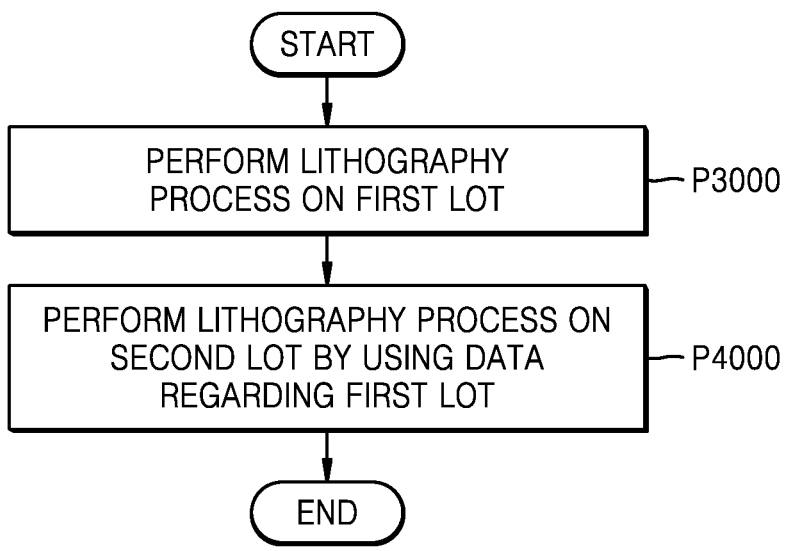

FIGS. 13 and 14 are flowcharts each illustrating a method of manufacturing a semiconductor device, according to some embodiments.

Referring to FIG. 13, in a process P1000, a lithography process may be performed on a first wafer. The performing of the lithography process may be identical to that described with reference to FIG. 1. Thus, in the process P1000, first and second-direction (X and Y-direction) combined overlay model functions, that is, dxc and dyc, of the first wafer may be calculated.

Next, in a process P2000, a lithography process may be performed on a second wafer by using data regarding the first wafer. According to some embodiments, the lithography process for the second wafer may be a lithography process modified by the combined overlay model functions of the first wafer. According to some embodiments, the lithography process may be modified to compensate for an overlay, which is calculated by the combined overlay model functions, that is, by dxc and dyc. According to some embodiments, the modification of the lithography process may include adjusting a light intensity, a scan speed, a scan direction, an offset, a rotation, a size, and the like.

According to some embodiments, since the lithography process may be modified based on wafer-to-wafer feedback, the yield and reliability in the manufacture of the semiconductor device may be improved.

Referring to FIG. 14, in a process P3000, similarly to the process P1000 in FIG. 13, a lithography process may be performed on a group of a plurality of wafers, for example, a first lot.

Next, in a process P4000, the lithography process may be performed on a second lot by using data regarding the first lot. According to some embodiments, the lithography process for the second lot may be a lithography process modified by combined overlay model functions of the first lot. According to some embodiments, the lithography process may be modified to compensate for an overlay, which is calculated by the combined overlay model functions, that is, by dxc and dyc. Unlike in FIG. 13, the method of manufacturing a semiconductor device in FIG. 14 may modify the lithography process based on lot-to-lot feedback, according to some embodiments.

While the inventive concept has been particularly shown and described with reference to embodiments thereof, it will be understood by those of ordinary skill in the art that various changes in form and details may be made therein without departing from the spirit and scope of the following claims. Therefore, it should be understood that the foregoing embodiments are provided for illustrative purposes only and are not to be construed in any way as limiting the inventive concept.

What is claimed is:

1. A method of manufacturing a semiconductor device, the method comprising:
   providing a first photoresist pattern on a wafer;
   measuring an overlay of the first photoresist pattern;
   generating a first overlay model function by a first overlay regression analysis of the measured overlay;
   generating a second overlay model function by a second overlay regression analysis of a difference between the measured overlay and the first overlay model function; and
   evaluating the first photoresist pattern by using a combined overlay model function of the first and second overlay model functions,
   wherein, when the first photoresist pattern is good, an etching process is performed by using the first photoresist pattern.

2. The method according to claim 1, wherein a basis of the first overlay model function is different from a basis of the second overlay model function.

3. The method according to claim 1, wherein the first overlay model function comprises a first or lower-order term for each of a first-direction coordinate and a second-direction coordinate.

4. The method according to claim 3, wherein the second overlay model function comprises a second or higher-order term for each of the first-direction coordinate and the second-direction coordinate.

5. The method according to claim 1, wherein the first overlay model function comprises a second or higher-order term for each of a first-direction coordinate and a second-direction coordinate.

6. The method according to claim 5, wherein the second overlay model function comprises a first or lower-order term for each of the first-direction coordinate and the second-direction coordinate.

7. The method according to claim 1,
   wherein, when the first photoresist pattern is not good, the first photoresist pattern is removed.

8. The method according to claim 7, further comprising:
   after the removal of the first photoresist pattern, providing a second photoresist pattern, which is overlay-compensated by using the combined overlay model function.

9. A method of manufacturing a semiconductor device, the method comprising:
   providing a first photoresist pattern on a first wafer;
   measuring an overlay of the first photoresist pattern;
   generating a first overlay model function by a first overlay regression analysis of the overlay;
   generating a second overlay model function by a second overlay regression analysis of a difference between the measured overlay and the first overlay model function; and
   providing a second photoresist pattern on a second wafer, the second photoresist pattern being overlay-compensated by the first and second overlay model functions.

10. The method according to claim 9, wherein the first and second overlay model functions do not have a basis common to each other.

11. The method according to claim 9, wherein the first overlay model function comprises a constant term and a first-order term.

12. The method according to claim 11, wherein the second overlay model function comprises third or higher-order terms.

13. The method according to claim 11, wherein an order of the highest-order term of the first overlay model function is 2.

14. A method of manufacturing a semiconductor device, the method comprising:
   providing a first photoresist material layer on a wafer;
   exposing the first photoresist material layer to a light pattern;
   measuring an overlay of the wafer;
   generating a first overlay model function by a first overlay regression analysis of the measured overlay;
   generating a second overlay model function by a second overlay regression analysis of a difference between the measured overlay and the first overlay model function;
   evaluating the first photoresist material layer by using a combined overlay model function of the first and second overlay model functions; and
   when the first photoresist material layer is good, performing a development process on the first photoresist material layer,
   wherein the first overlay model function comprises only first-order and/or lower than first-order terms and the second overlay model function comprises only second-order and/or higher than second-order terms.

15. The method according to claim 14, wherein the measuring of the overlay comprises measuring an overlay of the exposed first photoresist material layer.

16. The method according to claim 14, further comprising:
- evaluating the first photoresist material layer by using a combined overlay model function of the first and second overlay model functions; and
- when the first photoresist material layer is not good, removing the first photoresist material layer.

17. The method according to claim 16, further comprising:
- after the removing of the first photoresist material layer, providing a second photoresist material layer onto the wafer; and
- exposing the second photoresist material layer by using the combined overlay model function.

18. The method according to claim 14, further comprising:
- generating a photoresist pattern by developing the first photoresist material layer; and
- performing an etching process by using the photoresist pattern,
- wherein, after the performing of the etching process, the overlay is measured.

* * * * *